United States Patent
Lee et al.

(10) Patent No.: US 12,317,630 B2
(45) Date of Patent: May 27, 2025

(54) IMAGE SENSOR AND ELECTRONIC APPARATUS INCLUDING THE SAME

(71) Applicant: SAMSUNG ELECTRONICS CO., LTD., Suwon-si (KR)

(72) Inventors: Ji-Won Lee, Daegu (KR); Jeong-Jin Cho, Suwon-si (KR); Moo-Sup Lim, Yongin-si (KR); Sung-Young Seo, Bucheon-si (KR); Hae-Won Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 464 days.

(21) Appl. No.: 17/717,422

(22) Filed: Apr. 11, 2022

(65) Prior Publication Data

US 2022/0231073 A1    Jul. 21, 2022

Related U.S. Application Data

(60) Division of application No. 16/797,193, filed on Feb. 21, 2020, now Pat. No. 11,302,737, which is a
(Continued)

(30) Foreign Application Priority Data

Dec. 27, 2016 (KR) .................... 10-2016-0180138

(51) Int. Cl.
  *H10F 39/00*  (2025.01)
  *H04N 25/77* (2023.01)
  *H10F 39/18* (2025.01)

(52) U.S. Cl.
  CPC .......... *H10F 39/813* (2025.01); *H04N 25/77* (2023.01); *H10F 39/18* (2025.01); *H10F 39/802* (2025.01);
(Continued)

(58) Field of Classification Search
  CPC ......... H01L 27/14603; H01L 27/14612; H01L 27/14641; H01L 27/14636; H10F 39/813;
(Continued)

(56) References Cited

U.S. PATENT DOCUMENTS 6,107,655 A    8/2000 Guidash
6,352,869 B1   3/2002 Guidash
(Continued)

FOREIGN PATENT DOCUMENTS

CN    102157536    8/2011
JP    2008-124237   5/2008
(Continued)

OTHER PUBLICATIONS

Office Action dated Jan. 25, 2024 issued in corresponding U.S. Appl. No. 17/154,421.
(Continued)

*Primary Examiner* — Aaron J Gray
(74) *Attorney, Agent, or Firm* — MORGAN, LEWIS & BOCKIUS LLP

(57) ABSTRACT

This disclosure relates to image sensors and electronic apparatuses including the same. An image sensor including: a pixel area including shared pixels, wherein each of the shared pixels includes at least two photodiodes that form a group and share a floating diffusion (FD) area; and a transistor (TR) area adjacent to the pixel area, wherein the TR area includes transistor sets corresponding to the shared pixels, wherein, when a first shared pixel and a second shared pixel are arranged adjacent to each other in a first direction, a first TR set corresponding to the first shared pixel and a second TR set corresponding to the second shared pixel share a source region of a first selection TR.

7 Claims, 17 Drawing Sheets

Related U.S. Application Data continuation of application No. 15/854,356, filed on Dec. 26, 2017, now Pat. No. 10,608,037.

(52) U.S. Cl.
CPC ....... *H10F 39/8037* (2025.01); *H10F 39/811* (2025.01)

(58) Field of Classification Search
CPC .... H10F 39/18; H10F 39/802; H10F 39/8037; H10F 39/811; H04N 25/77
See application file for complete search history.

(56) References Cited

U.S. PATENT DOCUMENTS

| | | | |
|---|---|---|---|
| 7,767,952 | B2 | 8/2010 | Ohkawa |
| 7,924,333 | B2 | 4/2011 | Yin et al. |
| 8,723,999 | B2 | 5/2014 | Kido et al. |
| 9,165,959 | B2 | 10/2015 | Chen et al. |
| 9,524,995 | B2 | 12/2016 | Koo |
| 10,608,037 | B2 | 3/2020 | Lee et al. |
| 11,302,737 | B2 | 4/2022 | Lee |
| 2006/0208163 | A1 | 9/2006 | Manabe et al. |
| 2007/0215912 | A1* | 9/2007 | Kido .................. H10F 39/813 257/257 |
| 2008/0088724 | A1 | 4/2008 | Kudoh |
| 2009/0243025 | A1 | 10/2009 | Stevens et al. |
| 2011/0073923 | A1 | 3/2011 | Tatani et al. |
| 2011/0127408 | A1 | 6/2011 | Yanagita et al. |
| 2011/0181747 | A1* | 7/2011 | Kido .................. H10F 39/802 348/222.1 |
| 2011/0273597 | A1* | 11/2011 | Ishiwata ............... H04N 23/55 348/E9.002 |
| 2013/0049082 | A1 | 2/2013 | Kato et al. |
| 2014/0239152 | A1* | 8/2014 | Chen .................. H10F 39/8023 250/208.1 |
| 2015/0076326 | A1 | 3/2015 | Ohtsuki |
| 2017/0110503 | A1 | 4/2017 | Kato et al. |
| 2017/0236859 | A1 | 8/2017 | Otake et al. |
| 2017/0287972 | A1* | 10/2017 | Kato ..................... H10F 39/813 |
| 2017/0302872 | A1* | 10/2017 | Tanaka .................. H10F 39/18 |
| 2018/0182804 | A1 | 6/2018 | Lee et al. |
| 2020/0194485 | A1 | 6/2020 | Lee et al. |
| 2021/0143204 | A1 | 5/2021 | Lee et al. |

FOREIGN PATENT DOCUMENTS

| | | |
|---|---|---|
| JP | 2016-042557 | 3/2016 |
| JP | 2016040838 | 3/2016 |
| KR | 10-2014-0108940 A | 9/2014 |
| WO | 2015129226 | 9/2015 |
| WO | 2016-052219 | 4/2016 |
| WO | 2016-158439 | 10/2016 |

OTHER PUBLICATIONS

U.S. Office Action issued in corresponding U.S. Appl. No. 17/154,421 on Nov. 1, 2022.
Office Action issued in corresponding U.S. Appl. No. 17/825,059 on Sep. 25, 2024.
Office Action issued in corresponding KR Patent Application No. 10-2016-0180138 on Jan. 8, 2024.
Office Action issued in corresponding U.S. Appl. No. 17/154,421 on Jul. 25, 2024.
Chinese Office Action issued in corresponding CN Patent Application No. 201711346652.0 on Oct. 10, 2022.
U.S. Office Action issued in corresponding U.S. Appl. No. 17/154,421 on May 11, 2022.
Office Action issued in corresponding KR Patent Application No. 10-2016-0180138 on Jul. 24, 2023.
Notice of Allowance issued in corresponding U.S. Appl. No. 17/154,421 on Nov. 4, 2024.
Notice of Allowance issued in corresponding U.S. Appl. No. 17/825,059 on Feb. 27, 2025.

* cited by examiner

IMAGE SENSOR AND ELECTRONIC APPARATUS INCLUDING THE SAME

CROSS-REFERENCE TO RELATED APPLICATIONS

This application is a divisional of U.S. patent application Ser. No. 16/797,193 filed on Feb. 21, 2020, which is a continuation of U.S. patent application Ser. No. 15/854,356 filed on Dec. 26, 2017, now U.S. Pat. No. 10,608,037 issued on Mar. 31, 2020, which claims priority under 35 U.S.C. § 119 to Korean Patent Application No. 10-2016-0180138, filed on Dec. 27, 2016, in the Korean Intellectual Property Office, the disclosures of which are incorporated by reference herein in their entireties.

TECHNICAL FIELD

The inventive concept relates to an image sensor, and more particularly, to an image sensor having a shared pixel structure and an electronic apparatus including the image sensor.

DISCUSSION OF RELATED ART

Image sensors detect and convey information that constitutes an image. Image sensors include a plurality of unit pixels arranged in a two-dimensional array. For example, each of the plurality of unit pixels includes one photodiode and a plurality of pixel transistors. The plurality of pixel transistors may include a transfer transistor, a reset transistor, a source follower transistor, and a selection transistor. As a pixel size is reduced, a shared pixel structure has been employed in an image sensor to increase the area of a photodiode. In a shared pixel structure, the pixel transistors are shared by a plurality of pixels. For example, several pixels share the pixel transistors, and thus, the number of pixel transistors per unit pixel is reduced and the area of the photodiode is increased.

SUMMARY

According to an exemplary embodiment of the inventive concept, there is provided an image sensor including: a pixel area including shared pixels, wherein each of the shared pixels includes at least two photodiodes that form a group and share a floating diffusion (FD) area; and a transistor (TR) area adjacent to the pixel area, wherein the TR area includes transistor sets corresponding to the shared pixels, wherein, when a first shared pixel and a second shared pixel are arranged adjacent to each other in a first direction, a first TR set corresponding to the first shared pixel and a second TR set corresponding to the second shared pixel share a source region of a first selection TR.

According to an exemplary embodiment of the inventive concept, there is provided an image sensor including: a first shared pixel including four photodiodes that share a first floating diffusion (FD) area; a second shared pixel disposed adjacent to the first shared pixel in a first direction and including four photodiodes that share a second FD area; a first transistor (TR) set disposed adjacent to the first shared pixel and including a first reset TR, a first source follower TR, and a first selection TR, which are sequentially arranged along the first direction; and a second TR set disposed adjacent to the second shared pixel and including a second selection TR, a second source follower TR, and a second reset TR, which are sequentially arranged along the first direction, wherein the first selection TR and the second selection TR share a source region.

According to an exemplary embodiment of the inventive concept, there is provided an image sensor including: a first shared pixel including eight photodiodes that share a floating diffusion (FD) area, the eight photodiodes forming four photodiode pairs, each of the photodiode pairs including two adjacent photodiodes arranged along a first direction; and a first transistor (TR) set disposed adjacent to the first shared pixel and including a top selection TR, a top source follower TR, a top reset TR, a bottom reset TR, a bottom source follower TR, and a bottom selection TR, which are sequentially arranged along a second direction crossing the first direction, wherein the first TR set has a mirror symmetry structure with respect to an equivalent FD area shared by the top reset TR and the bottom reset TR.

According to an exemplary embodiment of the inventive concept, there is provided an image sensor including: a pixel unit including a pixel area and a transistor (TR) area, the pixel area including shared pixels arranged in a two-dimensional array, the shared pixels each including at least two photodiodes that form a group and share a floating diffusion (FD) area, the TR area including transistor sets adjacent to the shared pixels and corresponding to the shared pixels; and a peripheral circuit disposed around the pixel unit, wherein, when first and second shared pixels are disposed adjacent to each other along a first direction, a first TR set corresponds to the first shared pixel and a second TR set corresponds to the second shared pixel, and a selection TR of the first TR set and a selection TR of the second TR set share a source region.

According to an exemplary embodiment of the inventive concept, there is provided an electronic apparatus including: an optical system; an image sensor; and a signal processor circuit, wherein the image sensor includes a pixel unit including a pixel area and a transistor (TR) area, and a peripheral circuit disposed around the pixel unit, shared pixels including at least two photodiodes that form a group and share a floating diffusion (FD) area, are arranged in a two-dimensional array in the pixel area, and a TR set corresponding to each of the shared pixels is disposed in the TR area, and selection TRs of two adjacent TR sets share a source region.

According to an exemplary embodiment of the inventive concept there is provided an image sensor including a first shared pixel including a plurality of photodiodes; a second shared pixel including a plurality of photodiodes; a first transistor set disposed adjacent to the first shared pixel; and a second transistor set disposed adjacent to the second shared pixel, wherein the first transistor set includes a first selection transistor and the second transistor set includes a second selection transistor, and wherein a source region of the first and second selection transistors connects the first and second selection transistors to each other.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1A:
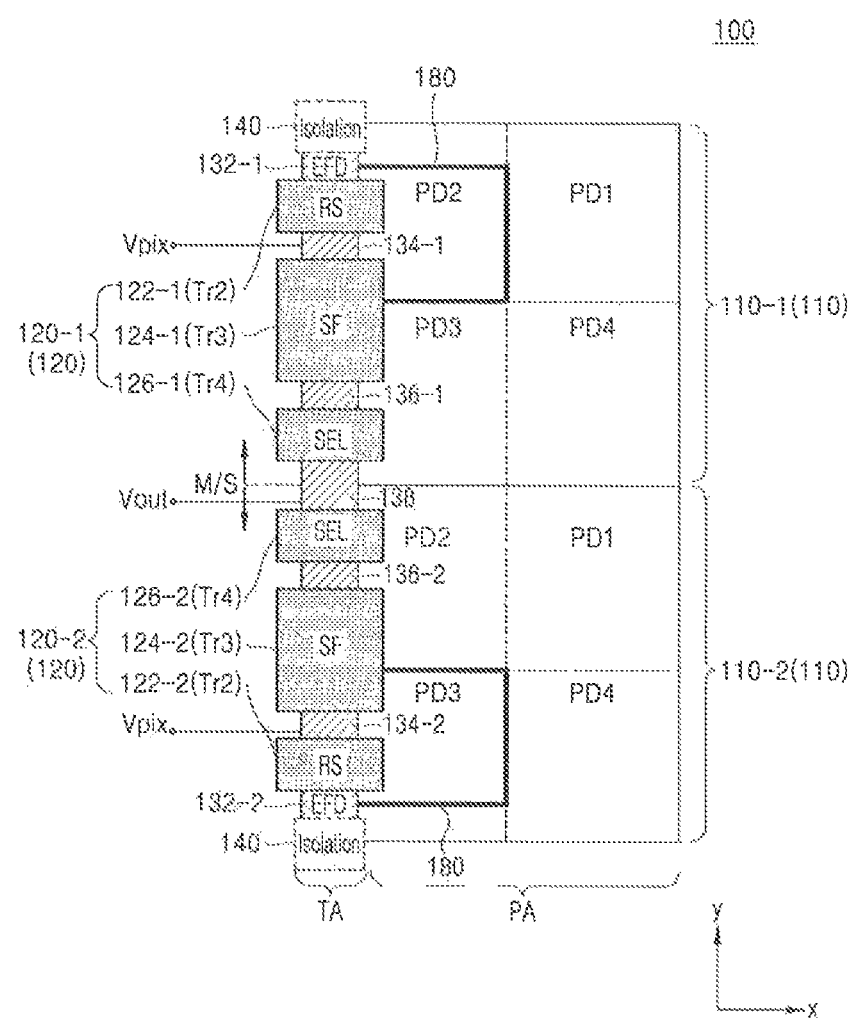
FIG. 1A is a view of a main part of a pixel unit of an image sensor according to an exemplary embodiment of the inventive concept.

Hereinafter, exemplary embodiments of the inventive concept will be described in detail with reference to the accompanying drawings. Like reference numerals may be used for like elements in the drawings, and redundant descriptions thereof may be omitted.

Figure 1B:
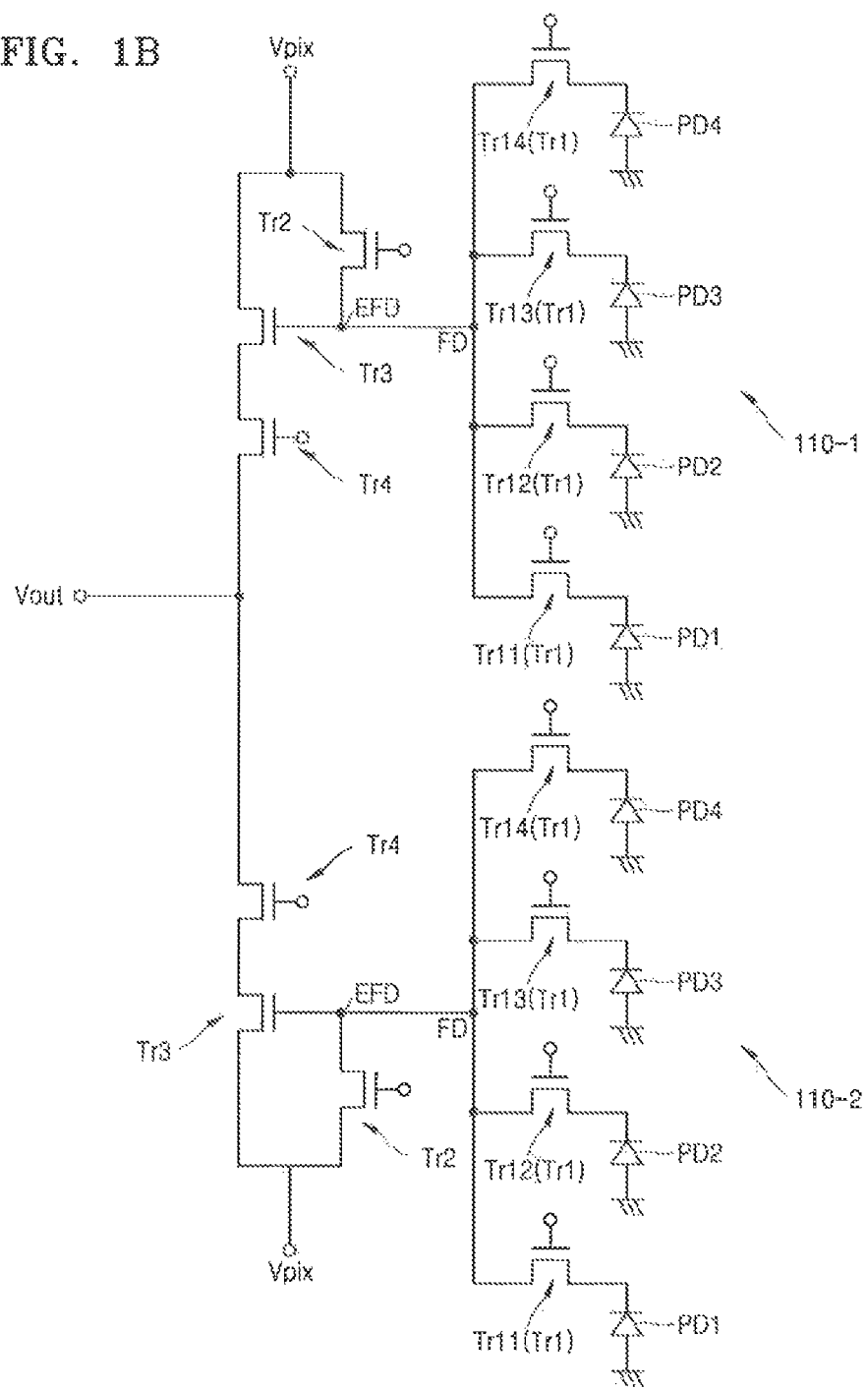
FIG. 1B is an equivalent circuit diagram corresponding to shared pixels and transistor sets of the image sensor illustrated in FIG. 1A according to an exemplary embodiment of the inventive concept.

FIG. 1A is a view of a main part of a pixel unit of an image sensor according to an exemplary embodiment of the inventive concept, and FIG. 1B is an equivalent circuit diagram corresponding to shared pixels and transistor sets of the image sensor illustrated in FIG. 1A, according to an exemplary embodiment of the inventive concept.

Figure 12:
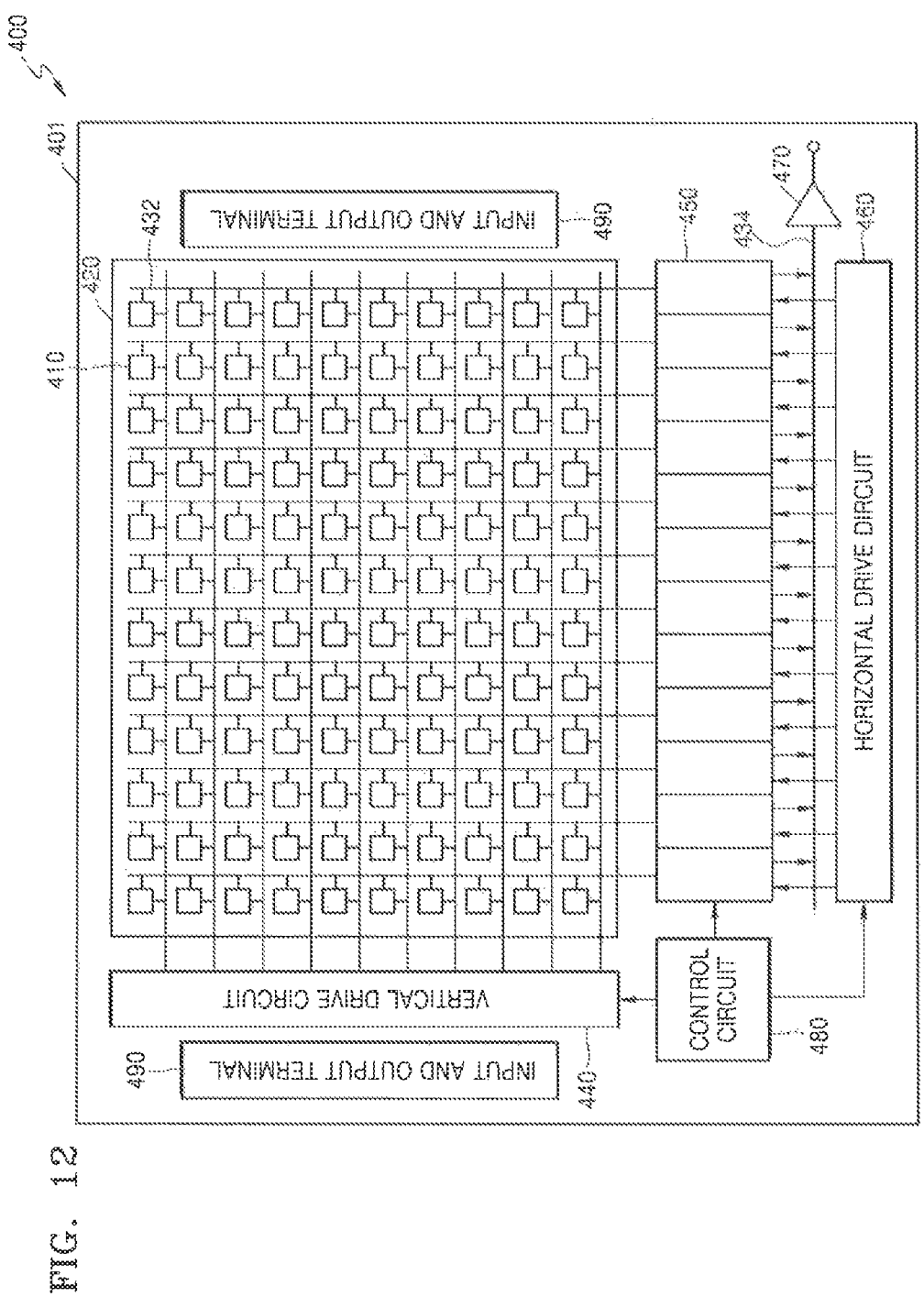
FIG. 12 is a view schematically illustrating a configuration of an image sensor according to an exemplary embodiment of the inventive concept.

Referring to FIGS. 1A and 1B, an image sensor 100 according to the present embodiment may include a pixel area PA and a transistor (TR) area TA within a pixel unit (refer, e.g., to reference numeral 420 of FIG. 12). Shared pixels 110 are arranged in the pixel area PA, and TR sets 120 may be arranged in the TR area TA.

Two shared pixels 110 may be arranged adjacent to each other along a second direction (y-direction). Although only two shared pixels 110 are shown in FIGS. 1A and 1B, as can be seen in FIG. 12, a plurality of shared pixels 110 having a two-dimensional array structure may be arranged in the pixel unit 420 along a first direction (x-direction) and the second direction (y-direction).

In the image sensor 100 according to the present embodiment, four pixels may constitute one shared pixel 110. For example, a first shared pixel 110-1 may have a structure in which first to fourth photodiodes PD1 to PD4 share one floating diffusion (FD) area (refer, e.g., to reference numeral 130 of FIG. 2) while surrounding the FD area 130. A second shared pixel 110-2 may also have a structure in which the first to fourth photodiodes PD1 to PD4 share the FD area 130.

In one of the shared pixels 110, sharing of the FD area 130 by the first to fourth photodiodes PD1 to PD4 may involve using transfer TRs corresponding to the four photodiodes PD1 to PD4. This can be gleaned from the equivalent circuit diagram of FIG. 1B. For example, a first transfer TR Tr11 corresponding to the first photodiode PD1, a second transfer TR Tr12 corresponding to the second photodiode PD2, a third transfer TR TR13 corresponding to the third photodiode PD3, and a fourth transfer TR Tr14 corresponding to the fourth photodiode PD4 may share the FD area 130 as a common drain region.

Thus, in one of the shared pixels 110, the first to fourth photodiodes PD1 to PD4 may share one of the FD areas 130 and the first to fourth photodiodes PD1 to PD4 may share one of the TR sets 120. The TR sets 120 may be adjacent to the pixel area PA and arranged in the TR area TA, and one of the TR sets 120 may be disposed in each of the shared pixels 110. Thus, the first to fourth photodiodes PD1 to PD4 that constitute one of the shared pixels 110 may share one of the TR sets 120. The TR set 120 may include a reset (RS) TR Tr2, a source follower (SF) TR Tr3, and a selection (SEL) TR Tr4. The TRs Tr2, Tr3, and Tr4 of the TR set 120 may be arranged in the second direction (y-direction), as illustrated in FIG. 1A.

A first TR set 120-1 will be described below in more detail. The reset TR Tr2 may include a reset gate electrode 122-1 and source/drain regions 132-1 and 134-1 arranged on both sides of the reset gate electrode 122-1. The source follower TR Tr3 may include a source follower gate electrode 124-1 and source/drain regions 134-1 and 136-1 arranged on both sides of the source follower gate electrode 124-1. The selection TR Tr4 may include a selection gate electrode 126-1 and source/drain regions 136-1 and 138 arranged on both sides of the selection gate electrode 126-1. The reset TR Tr2 and the source follower TR Tr3 may share the drain region 134-1, and the shared drain region 134-1 may be connected to a power supply voltage Vpix. In addition, the source region 136-1 of the source follower TR Tr3 and the drain region 136-1 of the selection TR Tr4 are the same, and an output voltage Vout may be output through the source region 138 of the selection TR Tr4.

The source region 132-1 of the reset TR Tr2 is connected to the FD area 130 through interconnection 180 and forms an equipotential area with respect to the FD area 130. Thus, the source region 132-1 of the reset TR Tr2 may be an equivalent FD area EFD. In addition, the source follower gate electrode 124-1 may be connected to the FD area 130 through the interconnection 180. Thus, the FD area 130, the source region 132-1 of the reset TR Tr2, and the source follower gate electrode 124-1 may form an equipotential area.

Regarding the connection relationship between the TRs Tr1, Tr2, Tr3, and Tr4, in reference to the equivalent circuit diagram of FIG. 1B, the first to fourth photodiodes PD1 to PD4 may be connected to source regions of corresponding first to fourth transfer TRs Tr11 to TR14. A drain region of each of the first to fourth transfer TRs Tr11 to Tr14 may be connected to the source region 132-1 of the reset TR Tr2. A common drain region of the first to fourth transfer TRs Tr11 to Tr14 may correspond to the FD region 130. The FD region 130 may be connected to the gate electrode 124-1 of the source follower TR Tr3. As illustrated in FIG. 1A, the drain region 134-1 of the reset TR Tr2 and the drain region 134-1 of the source follower TR Tr3 may be the same and may be connected to the power supply voltage Vpix. In addition, the source region 136-1 of the source follower TR Tr3 and the drain region 136-1 of the selection TR Tr4 may be the same. A vertical signal line (432 of FIG. 12) may be connected to the source region 138 of the selection TR. Tr4, and a voltage of the source region 138 of the selection TR Tr4 may be output as an output voltage Vout.

A second shared pixel 110-2 may be disposed adjacent to the first shared pixel 110-1 in the second direction (y-direction), and a second TR set 120-2 may be disposed in the TR area TA to correspond to the second shared pixel 110-2. As illustrated in FIG. 1A, the selection TR Tr4 of the first TR set 120-1 and a selection TR Tr4 of the second TR set 120-2 may share a source region 138. In addition, the first TR set 120-1 and the second TR set 120-2 may be in a mirror symmetry (M/S) relationship with respect to the source region 138 of the selection TR Tr4. For example, the reset TR Tr2, the source follower TR Tr3, and the selection TR Tr4 may be sequentially arranged from the equivalent FD area EFD in the first TR set 120-1 along the second direction (a y-direction), and the selection TR Tr4, the source follower TR Tr3, and the reset TR Tr2 may be sequentially arranged from the source region 138 in the second TR set 120-2 along the second direction (the y-direction). In addition, the reset TR Tr2 of the first TR set 120-1 and the reset TR Tr2 of the second TR set 120-2 may each be arranged adjacent to an isolation area 140 for junction isolation. In addition, the equivalent FD areas EFD, which are source regions 132-1 and 132-2, may be arranged between the isolation area 140 and the reset gate electrodes 122-1 and 122-2.

For example, in the image sensor 100 according to the present embodiment, a unit shared pixel may include one shared pixel 110 and one TR set 120 corresponding to the one shared pixel 110. In addition, a number of transfer TRs TO corresponding to a number of shared photodiodes may be disposed in the shared pixel 110. In addition, the TRs Tr2 to Tr4 of the TR set 120 and the transfer TRs Tr1 may also be referred to as pixel TRs. The image sensor 100 according to the present embodiment may be a complementary metal-oxide semiconductor (CMOS) image sensor, for example. The structure of the shared pixel 110 and the TR set 120 will be described in more detail with regard to FIGS. 2 to 3B.

In the image sensor 100 according to the present embodiment, the shared pixels 110, for example, the first shared pixel 110-1 and the second shared pixel 110-2, may be arranged adjacent to each other along the second direction (the y-direction), and the corresponding first TR set 120-1 and second TR set 120-2 may be arranged adjacent to each other along the second direction (the y-direction). In addition, the selection TR Tr4 of the first TR set 120-1 and the selection TR Tr4 of the second TR set 120-2 may share the source region 138, and the first TR set 120-1 and the second TR set 120-2 may be in a mirror symmetry (M/S) relationship with respect to the source region 138.

In the image sensor 100 according to the present embodiment, the shared pixels 110 and the TR set 120 with the above-described structure increase the area of a photodiode per unit shared pixel and reduce noise.

In an existing image sensor, TRs of a TR set corresponding to shared pixels are arranged in the same order as the order of TRs of a TR set of other shared pixels. In this case, an isolation area for junction isolation is disposed between adjacent TR sets. In other words, in the existing image sensor, an isolation area for junction isolation may be disposed per one shared pixel. Thus, in the existing image sensor, due to the area of the isolation area, the area of a source follower TR Tr3 and the area of a photodiode in a unit shared pixel may be reduced. Noise of the existing image sensor, for example, flicker noise, is in inverse proportion to the area of the source follower TR Tr3. Therefore, a reduction in the area of the source follower TR Tr3 may cause an increase in the noise of the existing image sensor. In addition, a reduction in the area of the photodiode in the unit shared pixel may cause a reduction in photoelectric conversion efficiency. Furthermore, in the existing image sensor, the isolation area may be the main cause for noise such as a dark current, a white spot, or random telegraph noise (RTN).

In contrast, in the image sensor 100 according to the present embodiment, two adjacent shared pixels 110 and two corresponding adjacent TR sets 120 share the source region 138 of the selection TR Tr4 and are arranged in a mirror symmetry structure so that an isolation area for junction isolation between the two TR sets 120 may be removed. Thus, the image sensor 100 according to the present embodiment may have reduced noise and increased photoelectric conversion efficiency in comparison to the above-described existing image sensor. For example, in the image sensor 100 according to the present embodiment, a half isolation area 140 may be formed per one shared pixel 110. An arrangement of the half isolation area 140 per one shared pixel 110 will be described in more detail with regard to FIG. 4.

Figure 2:
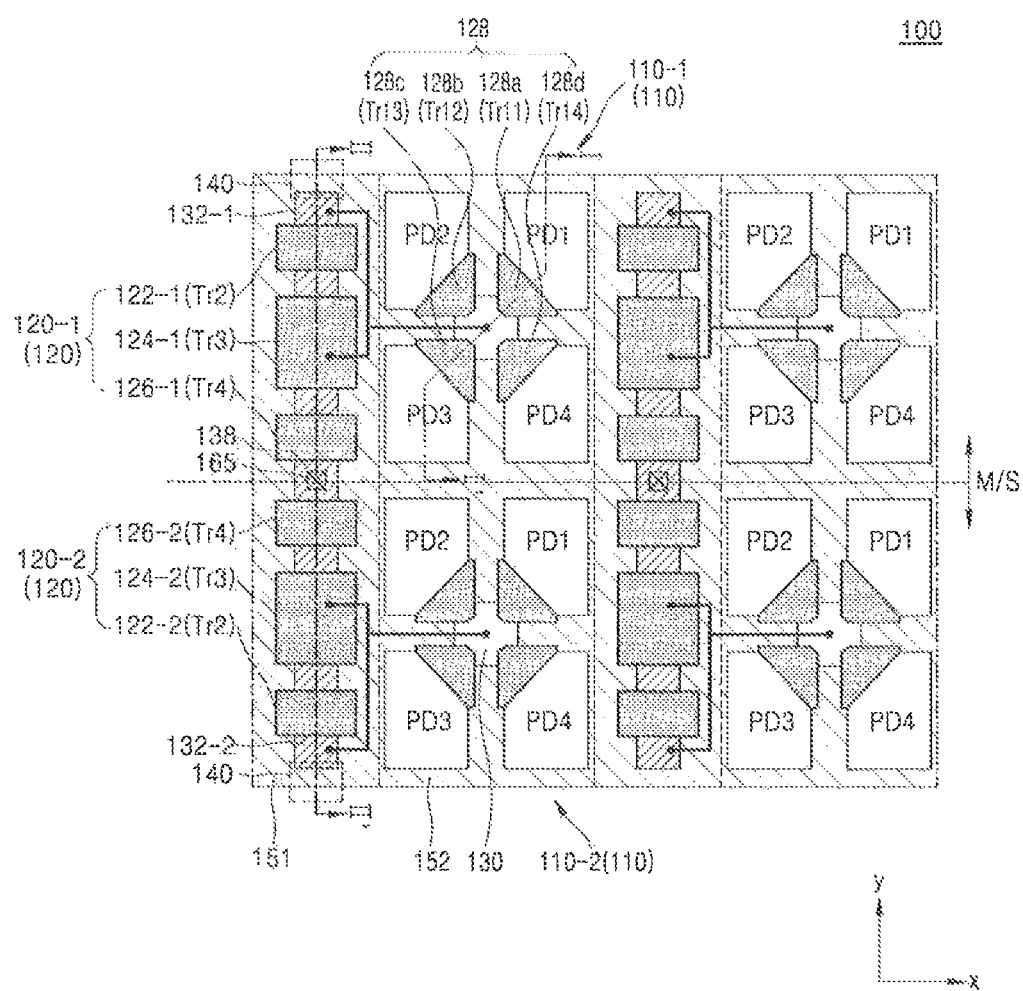
FIG. 2 is a schematic plan view of the main part of the pixel unit of the image sensor illustrated in FIG. 1A according to an exemplary embodiment of the inventive concept.
Figure 3A:
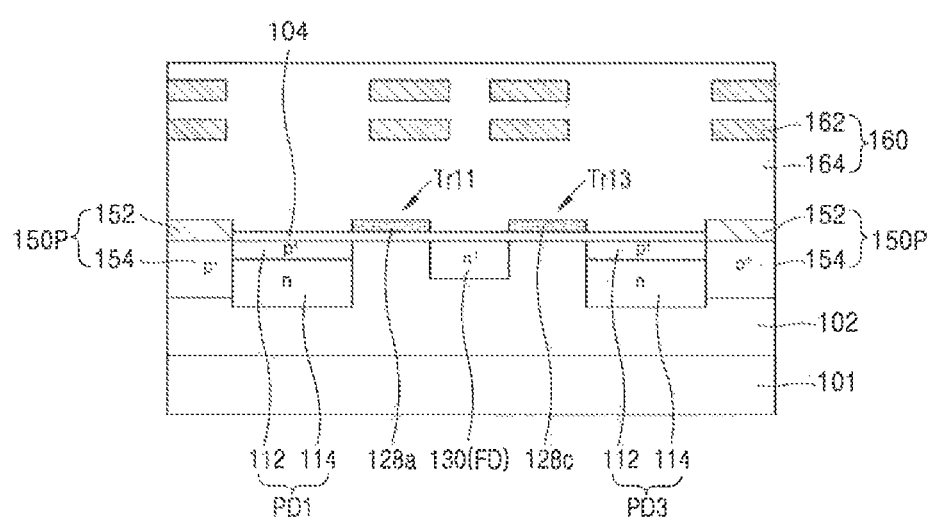
FIGS. 3A and 3B are cross-sectional views of the image sensor of FIG. 1A taken along lines I-I' and II-II' of FIG. 2, respectively, according to an exemplary embodiment of the inventive concept.
Figure 3B:
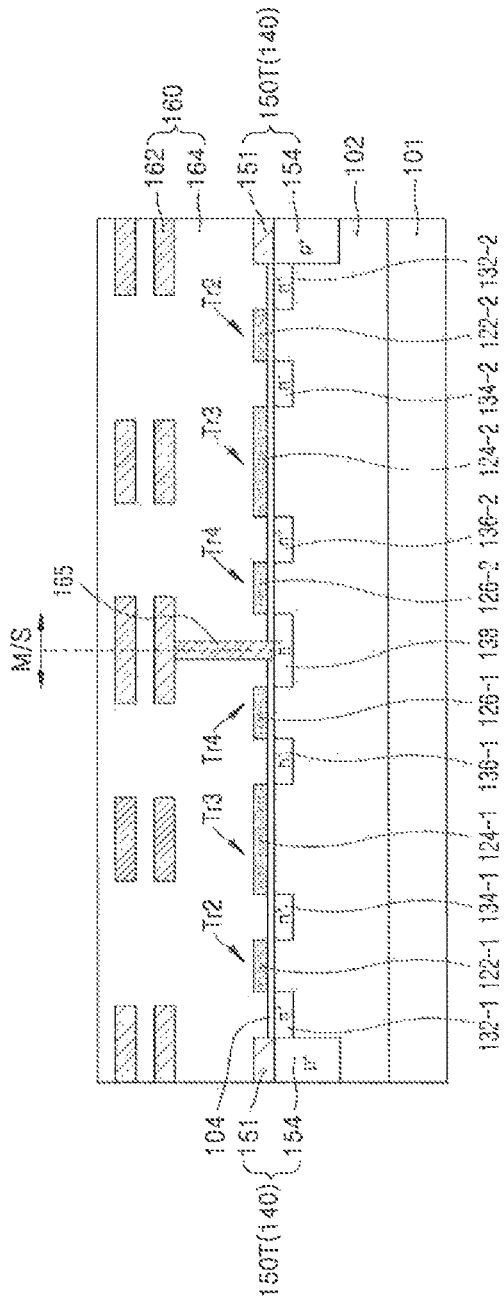

FIG. 2 is a schematic plan view of the main part of the pixel unit 420 of the image sensor 100 of FIG. 1A, according to an exemplary embodiment of the inventive concept, and FIGS. 3A and 3B are cross-sectional views of the image sensor 100 taken along lines I-I' and II-II' of FIG. 2, according to exemplary embodiments of the inventive concept.

Referring to FIGS. 2 to 3B, the image sensor 100 according to the present embodiment may have a structure in which shared pixels 110 share one FD area 130, which is surrounded by first to fourth photodiodes PD1 to PD4 of four pixels. The four photodiodes PD1 to PD4 may have a rectangular structure in which two photodiodes PD1 and PD2 or PD3 and PD4 are arranged adjacent to each other in the first direction (the x-direction) and two photodiodes PD1 and PD4 or PD2 and PD3 are arranged adjacent to each other in the second direction (the y-direction). The shared pixels 110 may be arranged in a two-dimensional array structure in which a plurality of shared pixels 110 are arranged along the first direction (the x-direction) and the second direction (the y-direction), as can be gleaned from the pixel unit 420 of FIG. 12.

Four transfer TRs Tr11 to Tr14 corresponding to the four photodiodes PD1 to PD4 may be arranged in the central part of the shared pixel 110, and the four transfer TRs Tr11 to Tr14 may share the FD area 130 as a common drain region.

For example, each of the four transfer TRs Tr11 to Tr14 may include the photodiode PD1, PD2, PD3, or PD4, a transfer gate electrode 128a, 128b, 128c, or 128d, and the FD area 130. The transfer TRs Tr11 to Tr14 are arranged so that electric charges generated in the four photodiodes PD1 to PD4 may be accumulated in the FD area 130 via the transfer TRs Tr11 to Tr14.

The corresponding TR sets 120 may be arranged adjacent to the shared pixel 110 in the TR area (TA of FIG. 1A). The TR sets 120 may be continuously arranged along the second direction (the y-direction) and may be arranged alternately with the shared pixel 110 along the first direction (the x-direction). The reset TR Tr2, the source follower TR Tr3, and the selection TR Tr4 of the TR set 120 may be arranged along the second direction (the y-direction).

The shared pixel 110 and the TR set 120 will be described in more detail with reference to FIGS. 3A and 3B. The first TR set 120-1 will be mainly described. The photodiodes PD1 to PD4 and the pixel TRs Tr1 to Tr4 may be formed in a p-type semiconductor well area 102 formed in a semiconductor substrate 101. The pixel TRs Tr1 to Tr4 may include the transfer TRs Tr1, and TRs Tr2, Tr3, and Tr4 of the TR set 120. The semiconductor substrate 101 may be an n-type semiconductor substrate, for example. However, the semiconductor substrate 101 is not limited to the n-type semiconductor substrate. The p-type semiconductor well area 102 may be formed in the semiconductor substrate 101, and the photodiodes PD1 to PD4 and the pixel TRs Tr1 to Tr4 may be formed in the p-type semiconductor well area 102. Each of the photodiodes PD1 to PD4 may be formed in a p-type semiconductor area 112 on the surface of the semiconductor substrate 101 and an n-type semiconductor area 114 under the p-type semiconductor area 112. The p-type semiconductor area 112 may be a p-type high-concentration impurity area. Each of the transfer TRs Tr11 to Tr14 may include the FD area 130 formed as an n-type semiconductor area, the corresponding photodiodes PD1 to PD4, and the corresponding transfer gate electrodes 128a to 128d, and the transfer gate electrodes 128a to 128d may be formed on a gate insulating layer 104. The FD area 130 may be an n-type high-concentration impurity area.

The reset TR Tr2 may include a pair of source/drain regions 132-1 and 134-1, and a reset gate electrode 122-1. The reset gate electrode 122-1 may be formed on the gate insulating layer 104. The source follower TR Tr3 may include a pair of source/drain regions 134-1 and 136-1, and a source follower gate electrode 124-1 on the gate insulating layer 104. The selection TR Tr4 may include a pair of source/drain regions 136-1 and 138, and a selection gate electrode 126-1 on the gate insulating layer 104.

Although not shown in FIGS. 3A and 3B, the FD area 130 may be electrically connected to the source region 132-1 of the reset TR Tr2, e.g., an equivalent FD area EFD, and the source follower gate electrode 124-1 through the interconnection 180.

A first isolation area 150P, in which the photodiodes PD1 to PD4 are isolated from one another, may be formed in the pixel area (PA of FIG. 1). The first isolation area 150P may include an insulating layer 152 on the surface of the first isolation area 150P, and a semiconductor layer 154 under the insulating layer 152. The insulating layer 152 may be an oxide layer such as a silicon oxide (SiO$_2$) layer, for example. The semiconductor layer 154 may be a p-type high-concentration impurity layer, for example.

A second isolation area 150T, in which the TRs Tr2, Tr3 and Tr4 of the TR set 120 are isolated from the photodiodes PD1 to PD4, may be formed in the TR area (TA of FIG. 1).

The second isolation area 150T may include an insulating layer 151 on the surface of the second isolation area 150T, and a semiconductor layer 154 under the insulating layer 151. The insulating layer 151 may be an oxide layer such as a silicon oxide layer, and the semiconductor layer 154 may be a p-type high-concentration impurity layer. The isolation area 140 for junction isolation may be included in the second isolation area 150T. For example, the isolation area 140 for junction isolation between the source region 132-1 of the reset TR Tr2 of the first TR set 120-1 and a source region of a reset TR of another adjacent TR set arranged in an upward direction (refer to FIG. 2) along the second direction (the y-direction) may be included in the second isolation area 150T. In addition, the isolation area 140 for junction isolation between the source region 132-2 of the reset TR Tr2 of the second TR set 120-2 and a source region of a reset TR of another adjacent TR set arranged in a downward direction (refer to FIG. 2) along the second direction (the y-direction) may be included in the second isolation area 150T. In some cases, the isolation area 140 may also be formed separately from the second isolation area 150T.

As illustrated in FIG. 3B, the selection TR Tr4 of the first TR set 120-1 and the selection TR Tr4 of the second TR set 120-2 may share the source region 138. Thus, no isolation area for junction isolation may be formed between the first TR set 120-1 and the second TR set 120-2. Accordingly, this contributes to a reduction in noise and an increase in the area of a photodiode per unit shared pixel, as described above with reference to FIGS. 1A and 1B.

In the image sensor 100 according to the present embodiment, each of the first isolation area 150P and the second isolation area 150T includes an insulating layer and a high-concentration impurity layer. However, the structure of the first isolation area 150P and the second isolation area 150T is not limited thereto. For example, isolation areas formed between the pixel unit (420 of FIG. 12) and a peripheral circuit unit and within the peripheral circuit unit may be formed in a shallow trench isolation (STI) structure in which trenches formed in the semiconductor substrate 101 or the semiconductor well area 102 are filled by an insulating layer.

A multi-layer interconnection layer 160 may be formed on the photodiodes PD1 to PD4 of the pixel area PA, on the FD area 130, on upper portions of the transfer TRs Tr11 to Tr14, and on upper portions of the TRs Tr2 to Tr4 of the TR area TA. The multi-layer interconnection layer 160 may include a plurality of interconnections 162 and an interlayer insulating layer 164, for example. The interconnections 162 may include a part of the interconnection 180 that electrically connects the FD area 130 to the source regions 132-1 and 132-2 of the reset TRs Tr2 and the source follower gate electrodes 124-1 and 124-2.

In addition, vertical contacts that connect the interconnections 162 to one another in a vertical direction or connect the interconnections 162 to a gate electrode or a source/drain region may be included in the multi-layer interconnection layer 160. For example, as illustrated in FIG. 3B, an output vertical contact 165 may be formed on the source region 138 shared by the selection TR Tr4 of each of the first TR set 120-1 and the second TR set 120-2 so that the interconnections 162 may be electrically connected to the source region 138. The interconnections 162 connected to the source region 138 may be a part of a vertical signal line (432 of FIG. 12), for example. In addition, the vertical contacts 165 may include a part of the interconnection 180 that electrically connects the source regions 132-1 and 132-2 of the reset TR Tr2 to the source follower gate electrodes 124-1 and 124-2.

In the image sensor 100 according to the present embodiment, because the first TR set 120-1 and the second TR set 120-2 share the source region 138, only one output vertical contact 165 connected to the source region 138 may be formed. Thus, a number of output vertical contacts 165 of the image sensor 100 may be reduced. For example, in the existing image sensor, one output vertical contact is formed per one TR set. However, in the image sensor 100 according to the present embodiment, one output vertical contact is formed per two TR sets so that the number of output vertical contacts may be reduced by half compared to that of the existing image sensor.

A planarization layer may also be disposed on the multilayer interconnection layer 160, and color filters and microlenses may be arranged on the planarization layer. When the image sensor has a back side illumination (BSI) structure, the color filters and the microlenses may be arranged on a lower portion of the semiconductor substrate 101.

Figure 4:
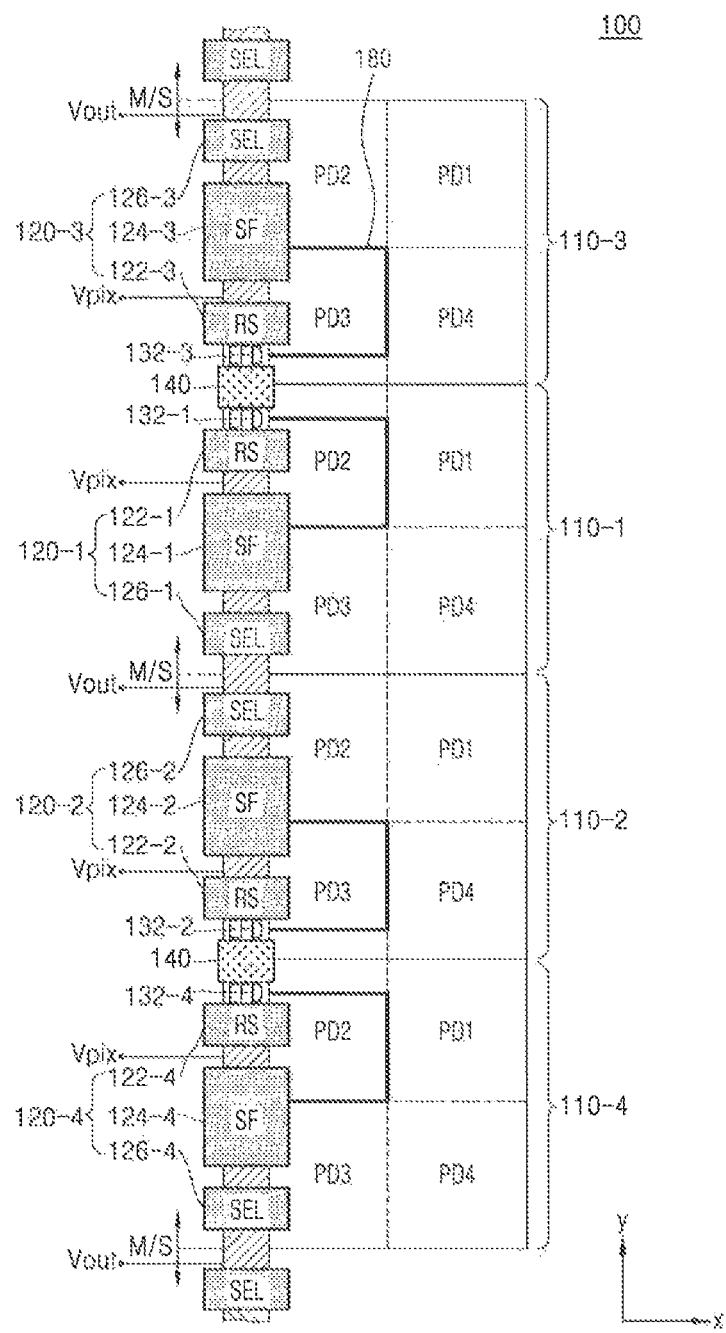
FIG. 4 is an enlarged view of the main part of the pixel unit of the image sensor of FIG. 1A according to an exemplary embodiment of the inventive concept.

FIG. 4 is an enlarged view of the main part of the pixel unit 420 of the image sensor 100 of FIG. 1A, according to an exemplary embodiment of the inventive concept.

Referring to FIG. 4, a third shared pixel 110-3 may be disposed adjacent to a first shared pixel 110-1 in an upward direction along the second direction (the y-direction), and a fourth shared pixel 110-4 may be disposed adjacent to a second shared pixel 110-2 in a downward direction along the second direction (y-direction). In addition, along the second direction (y-direction), a third TR set 120-3 corresponding to the third shared pixel 110-3 may be disposed adjacent to the first TR set 120-1, and a fourth TR set 120-4 corresponding to the fourth shared pixel 110-4 may be disposed adjacent to the second TR set 120-2.

As illustrated in FIG. 4, the isolation area 140 for junction isolation may be disposed between the first TR set 120-1 and the third TR set 120-3 and between the second TR set 120-2 and the fourth TR set 120-4. Thus, a source region 132-1 of the reset TR Tr2 of the first TR set 120-1 and a source region 132-3 of the reset TR Tr2 of the third TR set 120-3 may be electrically isolated from each other by the isolation area 140. In addition, the source region 132-2 of the reset TR Tr2 of the second TR set 120-2 and the source region 132-4 of the reset TR Tr2 of the fourth TR set 120-4 may be electrically isolated from each other by the isolation area 140.

The first shared pixel 110-1 and the third shared pixel 110-3 may share one isolation area 140. In addition, the second shared pixel 110-2 and the fourth shared pixel 110-4 may also share one isolation area 140. Thus, in the image sensor 100 according to the present embodiment, a half isolation area 140 may be formed per one shared pixel. Compared to the existing image sensor in which one isolation area is formed per one shared pixel, the ratio of arrangement of the isolation area 140 in the image sensor 100 according to the present embodiment may be reduced by about 50%.

Similarly to the arrangement structure of the first TR set 120-1 and the second TR set 120-2, the third TR set 120-3 and other TR sets disposed in an upward direction along the second direction (the y-direction) may share a source region of the selection TR Tr4 and may form a mirror symmetry (M/S) relationship with respect to the source region. In addition, the fourth TR set 120-4 and other TR sets disposed in a downward direction along the second direction (the y-direction) may share a source region of the selection TR Tr4 and may form a mirror symmetry (M/S) relationship with respect to the source region.

Figure 5:
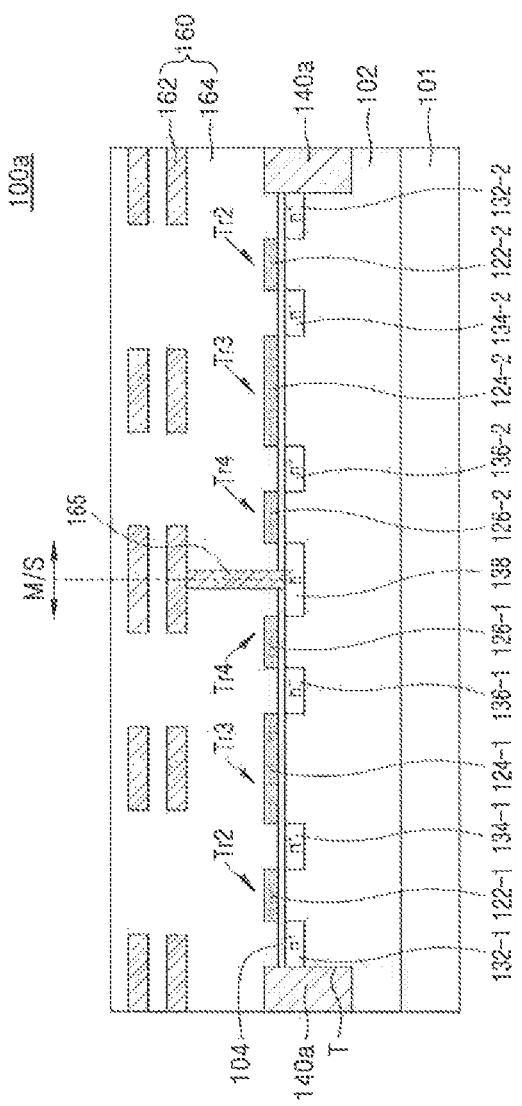
FIG. 5 is a cross-sectional view of a main part of a pixel unit of an image sensor according to an exemplary embodiment of the inventive concept, which corresponds to FIG. 3B.

FIG. 5 is a cross-sectional view of a main part of a pixel unit of an image sensor according to an exemplary embodiment of the inventive concept, which corresponds to FIG. 3B.

Referring to FIG. 5, an image sensor 100a according to the present embodiment may be different from the image sensor 100 of FIG. 2 in terms of the structure of an isolation area 140a. For example, in the image sensor 100 of FIG. 2, as illustrated in FIG. 3B, the isolation area 140 may include an insulating layer 151 and a semiconductor layer 154, and the semiconductor layer 154 may be a p-type high-concentration impurity layer, for example. In the image sensor 100a of FIG. 5 according to the present embodiment, the isolation area 140a may be formed in an STI structure in which trenches T formed in the semiconductor well area 102 are filled by an insulating layer. The insulating layer may be an oxide layer such as a silicon oxide layer, for example.

In the image sensor 100a according to the present embodiment, the isolation area 140a may be formed as a part of a second isolation area 150T. In other words, the second isolation area 150T may be formed in an STI structure, and a part of the second isolation area 150T may be used as the isolation area 140a for junction isolation. However, in some cases, the isolation area 140a may also be formed separately from the second isolation area 150T. For example, the second isolation area 150T may be formed in a structure of the insulating layer 151 and the semiconductor layer 154, as illustrated in FIG. 3B, and the isolation area 140a may be formed in an STI structure.

In the image sensor 100a according to the present embodiment, the first isolation area 150P (refer to FIG. 3A) may be formed in the structure of an insulating layer 152 and a semiconductor layer 154, like in the image sensor 100 of FIG. 2. However, the first isolation area 150P may also be formed in an STI structure.

Figure 6:
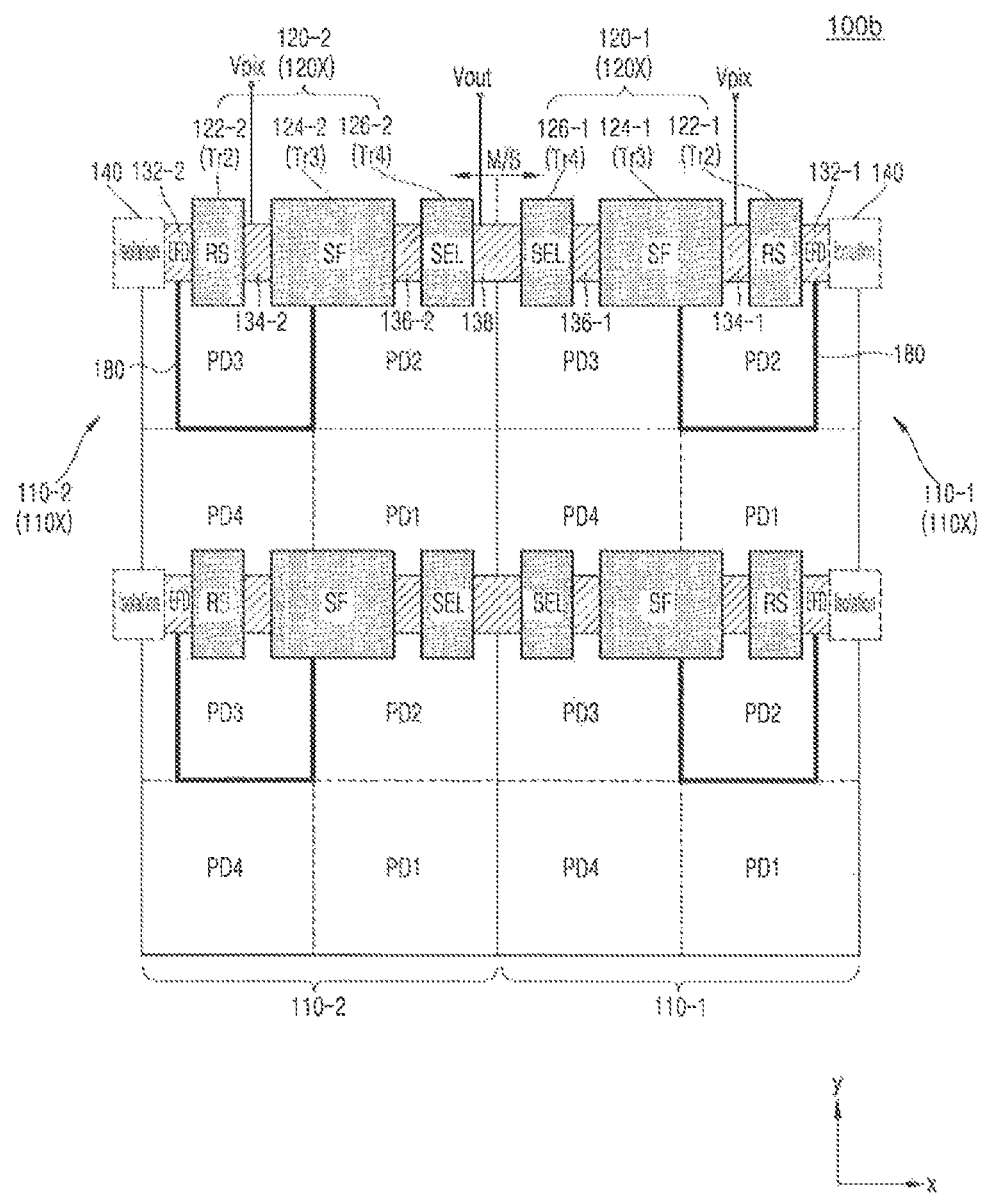
FIG. 6 is a view of a main part of a pixel unit of an image sensor according to an exemplary embodiment of the inventive concept.

FIG. 6 is a view of a main part of a pixel unit of an image sensor according to an exemplary embodiment of the inventive concept.

Referring to FIG. 6, an image sensor 100b according to the present embodiment may be different from the image sensor 100 of FIG. 1 in that TRs Tr2 to Tr4 of a TR set 120X are arranged in the first direction (an x-direction). For example, a first shared pixel 110-1 and a second shared pixel 110-2 may be arranged adjacent to each other in the first direction (the x-direction), and a first TR set 120-1 and a second TR set 120-2 corresponding to the first shared pixel 110-1 and the second shared pixel 110-2, respectively, may also be arranged adjacent to each other in the first direction (the x-direction). In addition, the first TR set 120-1 may include a reset TR Tr2, a source follower TR Tr3, and a selection TR Tr4, which are arranged in the first direction (x-direction), and the second TR set 120-2 may include a selection TR Tr4, a source follower TR Tr3, and a reset TR Tr2, which are arranged in the first direction (the x-direction). The selection TR Tr4 of the first TR set 120-1 and the selection TR Tr4 of the second TR set 120-2 may share a source region 138, and the first TR set 120-1 and the second TR set 120-2 may have mirror symmetry (M/S) with respect to the source region 138.

A source region 132-1 of the reset TR Tr2 of the first TR set 120-1 may be connected to an FD area of the first shared pixel 110-1 and a source follower gate electrode 124-1 through interconnection 180. An isolation area 140 for junction isolation may be disposed adjacent to the source region 132-1. In addition, a source region 132-2 of the reset TR Tr2 of the second TR set 120-2 may be connected to an FD area of the second shared pixel 110-2 and a source follower gate electrode 124-2 through the interconnection 180. The isolation area 140 for junction isolation may be disposed adjacent to the source region 132-2. Because the selection TR Tr4 of the first TR set 120-1 and the selection TR Tr4 of the second TR set 120-2 share the source region 138, no isolation area for junction isolation is formed between the first TR set 120-1 and the second TR set 120-2.

In reference to the views of FIGS. 1A and 6, the image sensor 100b according to the present embodiment may have a similar structure to that of the image sensor 100 of FIG. 1A rotated clockwise by 90°. However, the image sensor 100b according to the present embodiment and the image sensor 100 of FIG. 1A may be different from each other. For example, in a pixel unit (refer to reference numeral 420 of FIG. 12) of an image sensor, a number of shared pixels arranged in the first direction (the x-direction) and a number of shared pixels arranged in the second direction (a y-direction) may be different from each other. In addition, due to a difference in the number of shared pixels, the length of the pixel unit 420 in the first direction (the x-direction) and the length of the pixel unit 420 in the second direction (the y-direction) may be different from each other. In addition, a shape of a display that displays an image signal may vary according to a shape of the pixel unit 420. In addition, the configuration and structure of a peripheral circuit unit disposed around the pixel unit 420 may vary.

In the image sensor 100 of FIG. 1A and the image sensor 100b according to the present embodiment, directions in which the TRs Tr2 to Tr4 of the TR sets 120 and 120X are arranged are different from each other. However, adjacent TR sets 120 and 120X share a source region of the selection TR Tr4 so that the isolation area 140 for junction isolation is omitted between the adjacent TR sets 120 and 120X, and thus, electrical characteristics are improved. Thus, the image sensor 100 of FIG. 1A and the image sensor 100b according to the present embodiment have substantially similar features.

The image sensor 100b according to the present embodiment in which the shared pixel 110X and the TR set 120X are arranged adjacent to each other in the first direction (x-direction) and two adjacent TR sets 120X share the source region of the selection TR Tr4 may be also applied to image sensors having shared pixels of different numbers of photodiodes.

Figure 7A:
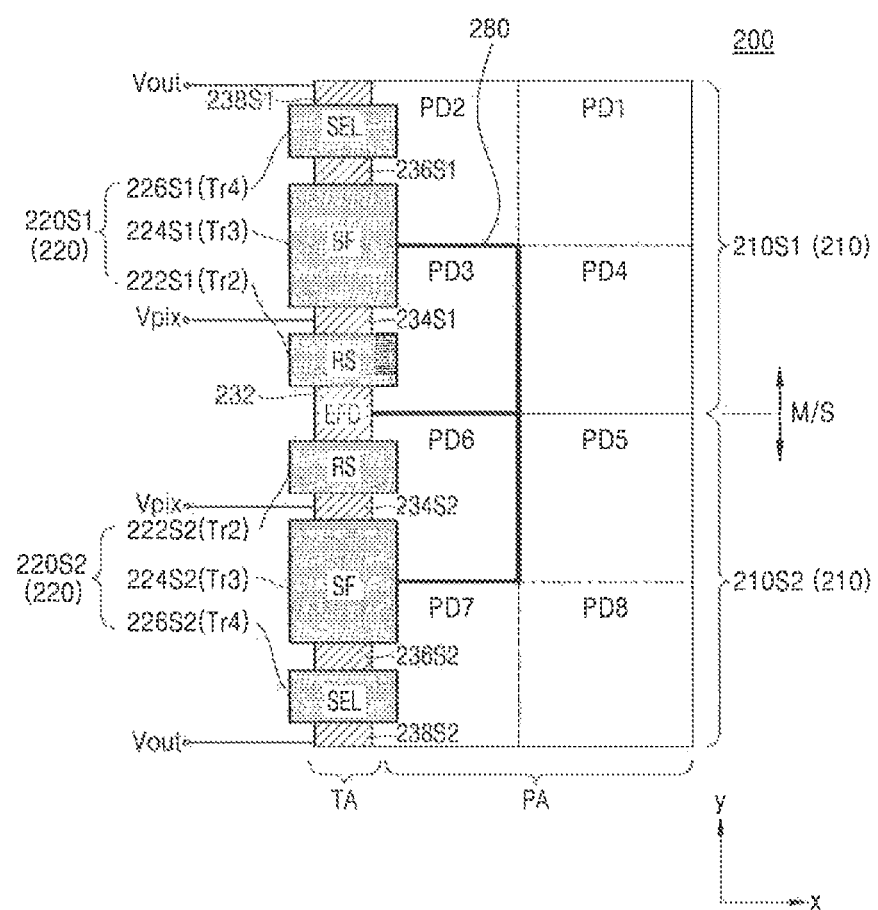
FIG. 7A is a view of a main part of a pixel unit of an image sensor according to an exemplary embodiment of the inventive concept.
Figure 7B:
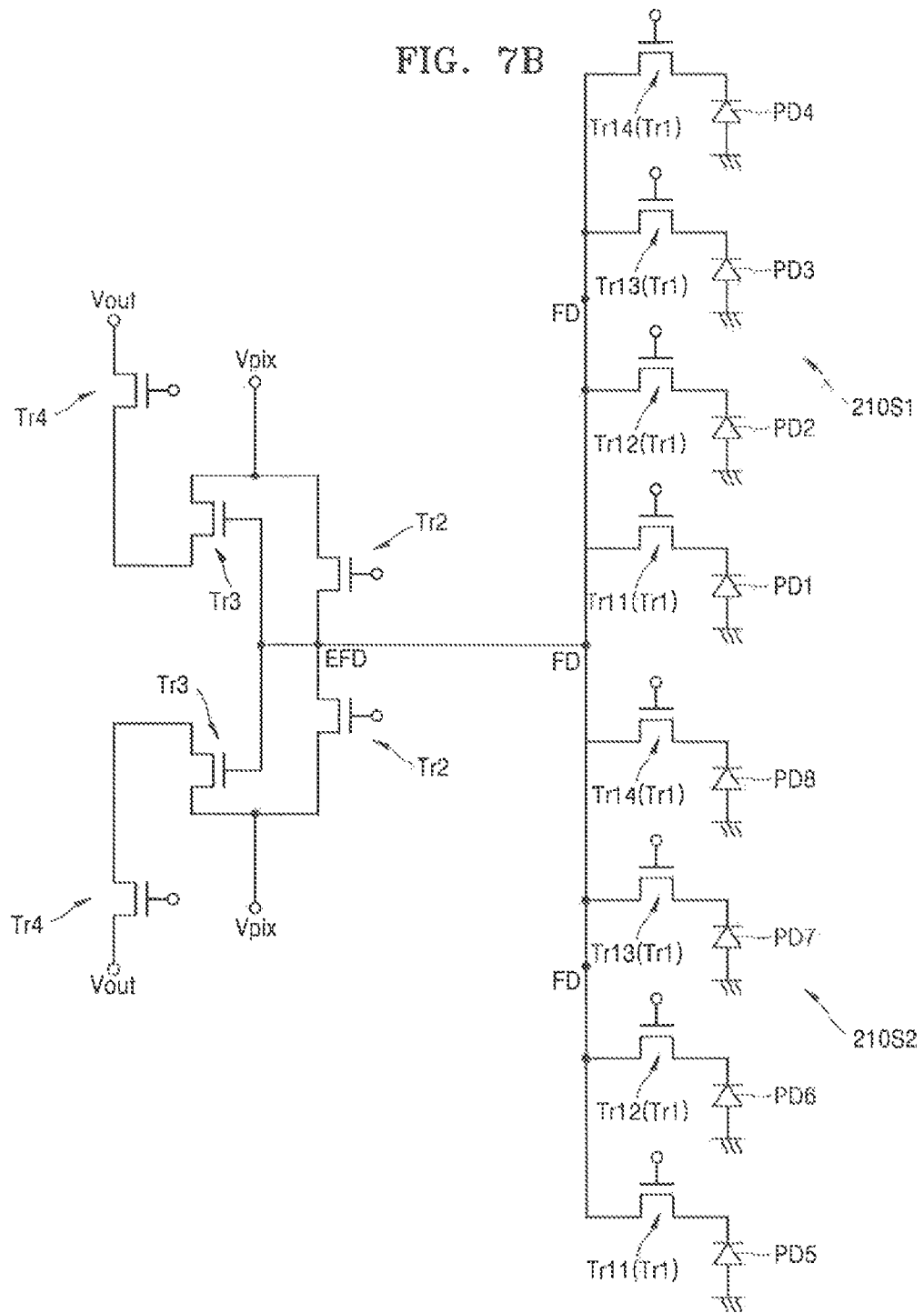
FIG. 7B is an equivalent circuit diagram corresponding to shared pixels and transistor sets of the image sensor illustrated in FIG. 7A according to an exemplary embodiment of the inventive concept.

FIG. 7A is a view of a main part of a pixel unit of an image sensor according to an exemplary embodiment of the inventive concept, and FIG. 7B is an equivalent circuit diagram corresponding to shared pixels and transistors sets of the image sensor of FIG. 7A, according to an exemplary embodiment of the inventive concept.

Referring to FIGS. 7A and 7B, in an image sensor 200 according to the present embodiment, eight pixels may constitute one shared pixel 210. For example, the shared pixel 210 may have a structure in which four photodiode pairs PD1-PD2, PD3-PD4, PD5-PD6, and PD7-PD8, each of which includes two adjacent photodiodes in the first direction (the x-direction), are arranged along the second direction (the y-direction). In addition, the shared pixel 210 may include a top shared pixel 210S1 in which four photodiodes PD1 to PD4 share one top FD area (230S1 of FIG. 8A) while surrounding the top FD area 230S1, and a bottom shared pixel 210S2 in which the other four photodiodes PD5 to PD8 share a bottom FD area (230S2 of FIG. 8A) while surrounding the bottom FD area 230S2. The top FD area 230S1 and the bottom FD area 230S2 may be connected to each other through interconnection 280, may form an equipotential area, and thus, may function as one FD area 230.

Thus, the shared pixel 210 has a structure in which eight photodiodes PD1 to PD8 share one FD area 230.

In the shared pixel 210, sharing of one FD area 230 by the eight photodiodes PD1 to PD8 may involve using transfer TRs Tr1 corresponding to the photodiodes PD1 to PD8, as shown in the equivalent circuit diagram of FIG. 7B. For example, in the top shared pixel 210S1, four transfer TRs Tr11 to Tr14 corresponding to four photodiodes PD1 to PD4 may share the top FD area 230S1 as a common drain region. In addition, in the bottom shared pixel 210S2, four transfer TRs Tr11 to Tr14 corresponding to four photodiodes PD5 to PD8 may share the bottom FD area 230S2 as a common drain area. As described above, the top FD area 230S1 and the bottom FD area 230S2 may be electrically connected to each other by using the interconnection 280, thereby constituting one FD area 230.

Figure 8A:
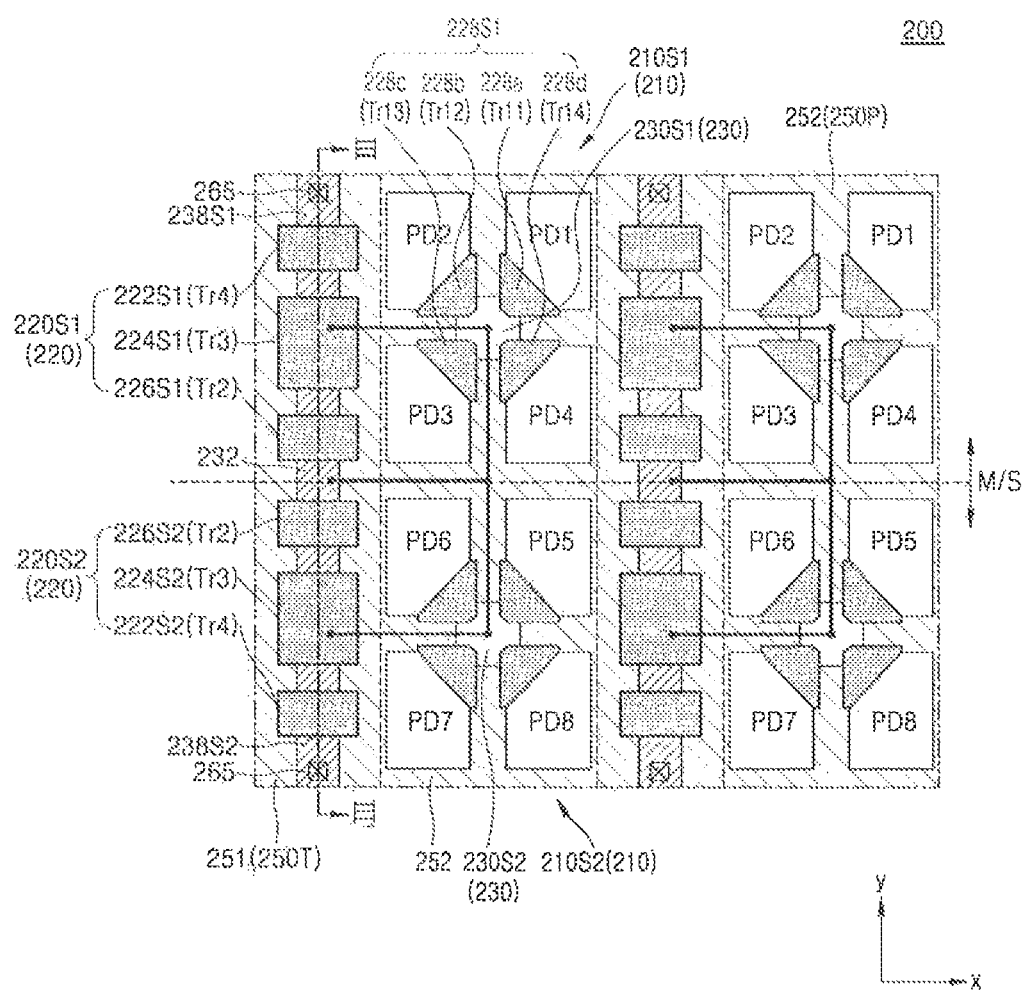
FIG. 8A is a schematic plan view of the main part of the pixel unit of the image sensor of FIG. 7A according to an exemplary embodiment of the inventive concept.

Thus, in the shared pixel 210, the eight photodiodes PD1 to PD8 may share one FD area 230 and the eight photodiodes PD1 to PD8 may share one TR set 220. The TR set 220 may be disposed adjacent to a pixel area PA in a TR area TA, and one TR set 220 may be disposed per one shared pixel 210. Thus, the eight photodiodes PD1 to PD8 that constitute the shared pixel 210 may share one TR set 220. However, as illustrated in FIGS. 7A, 7B and 8A, one TR set 220 may include two reset TRs Tr2, two source follower TRs Tr3, and two selection TRs TR4. For example, the TR set 220 may include a top TR set 220S1 and a bottom TR set 220S2 adjacent to each other in the second direction (the y-direction).

The top TR set 220S1 and the bottom TR set 220S2 may have mirror symmetry (M/S) with respect to an equivalent FD area EFD. The equivalent FD area EFD is electrically connected to the FD area 230 through the interconnection 280, may form an equipotential area with respect to the FD area 230, and may constitute a common source area 232 of two adjacent reset TRs Tr2. In other words, the reset TR Tr2 of the top TR set 220S1 and the reset TR Tr2 of the bottom TR set 220S2 may share the source region 232.

For example, in the top TR set 220S1, the reset TR Tr2 may include a reset gate electrode 222S1 and source/drain regions 232 and 234S1 disposed at both sides of the reset gate electrode 222S1, the source follower TR Tr3 may include a source follower gate electrode 224S1 and source/drain regions 234S1 and 236S1 disposed at both sides of the source follower gate electrode 224S1, and the selection TR Tr4 may include a selection gate electrode 226S1 and source/drain regions 236S1 and 238S1 disposed at both sides of the selection gate electrode 226S1. The reset TR Tr2 and the source follower TR Tr3 may share the drain region 234S1, and the shared drain region 234S1 may be commonly connected to a power supply voltage Vpix. In addition, the source region 236S1 of the source follower TR Tr3 and the drain region 236S1 of the selection TR Tr4 may be the same, and an output voltage Vout may be output through the source region 238S1 of the selection TR Tr4.

The bottom TR set 220S2 may include TRs Tr2, Tr3, and Tr4, which are in a mirror symmetry (M/S) relationship with respect to an equivalent FD area EFD. For example, the TRs Tr2, Tr3, and TR4 of the bottom TR set 220S2 are arranged in a substantially symmetrical manner with that of the TRs Tr2, Tr3, and Tr4 of the top TR set 220S1 on the other side of the source region 232 of the reset TR Tr2.

The FD area 230 may be connected to the source region 232 of the reset TR Tr2 that is the equivalent FD area EFD through the interconnection 280 and may also be connected to two source follower gate electrodes 224S1 and 224S2. Thus, the FD area 230, the source region 232 of the reset TR Tr2, and the two source follower gate electrodes 224S1 and 224S2 may form an equipotential area.

The connection relationship between the TRs Tr1, Tr2, Tr3, and Tr4 will now be described with reference to the equivalent circuit diagram of FIG. 7B. Four photodiodes PD1 to PD4 of the top shared pixel 210S1 may be connected to a source region of four corresponding transfer TRs Tr11 to TR14. In addition, four photodiodes PD5 to PD8 of the bottom shared pixel 210S2 may be connected to the source region of the four corresponding transfer TRs Tr11 to TR14.

The transfer TRs Tr11 to Tr14 of the top shared pixel 210S1 and the transfer TRs Tr11 to Tr14 of the bottom shared pixel 210S2 may share the FD area 230 as a common drain region. For example, as shown in FIG. 8A, the FD area 230 may include the top FD area 230S1 disposed in the center of the top shared pixel 210S1, and the bottom FD area 230S2 disposed in the center of the bottom shared pixel 210S2. The transfer TRs Tr11 to Tr14 of the top shared pixel 210S1 may share the top FD area 230S1 as a common drain region, and the transfer TRs Tr11 to Tr14 of the bottom shared pixel 210S2 may share the bottom FD area 230S2 as a common drain region. The top FD area 230S1 and the bottom FD area 230S2 may be electrically connected to each other through the interconnection 280.

A drain region of the transfer TRs Tr11 to Tr14, e.g., the FD area 230, may be connected to the source region 232 shared by two adjacent reset TRs Tr2, e.g., the equivalent FD area EFD. In addition, the FD area 230 may be connected to the two source follower gate electrodes 224S1 and 224S2. The FD area 230 is connected to the source region 232 and the two source follower gate electrodes 224S1 and 224S2 through the interconnection 280. A connection structure of the interconnection 280 may finger like, as indicated by a thick straight line of FIG. 7A.

A source region of each of two source follower TRs Tr3 may be connected to the drain region of the corresponding selection TR Tr4. The drain region of the reset TR Tr2 and the drain region of the source follower TR Tr3 of the top TR set 220S1 may be the same and may be connected to the power supply voltage Vpix. In addition, the drain region of the reset TR Tr2 and the drain region of the source follower TR Tr3 of the bottom TR set 220S2 may be the same and may be connected to the power supply voltage Vpix. A vertical signal line (432 of FIG. 12) may be connected to the source regions 238S1 and 238S2 of the selection TR. Tr4 of the top TR set 220S1 and the selection TR Tr4 of the bottom TR set 220S2 so that a voltage of the source regions 238S1 and 238S2 may be output as the output voltage Vout.

In the image sensor 200 according to the present embodiment, a unit shared pixel may include one shared pixel 210 and one TR set 220 corresponding to the shared pixel 210. Transfer TRs Tr1 having an amount corresponding to the amount of shared photodiodes may be disposed in the shared pixel 210. For example, in the image sensor 200 according to the present embodiment, the unit shared pixel may include eight photodiodes PD1 to PD8, eight transfer TRs Tr1, two reset TRs Tr2, two source follower TRs Tr3, and two selection TRs Tr4. The image sensor 200 according to the present embodiment may be a CMOS image sensor, for example. The structure of the shared pixel 210 and the TR set 220 will be described in more detail with reference to FIGS. 8A and 8B.

In the image sensor 200 according to the present embodiment, the shared pixel 210 may have a structure in which eight photodiodes PD1 to PD8 share one FD area 230. In addition, the reset TR Tr2 of the top TR set 220S1 and the reset TR Tr2 of the bottom TR set 220S2 may share the equivalent FD area EFD that is the source region 232. In addition, the top TR set 220S1 and the bottom TR set 220S2 may be in a mirror symmetry (M/S) relationship with respect to the equivalent FD area EFD. In addition, the TR set 220 may share source regions 238S1 and 238S2 of selection TRs Tr4 of another TR set 220 adjacent thereto in the second direction (y-direction). Thus, an isolation area for junction isolation may be omitted between the two adjacent TR sets 220. For example, in the existing image sensor having shared pixels of eight photodiodes, one isolation area may be formed per one shared pixel. In the image sensor 200 according to the present embodiment, no isolation area may be formed per one shared pixel.

Sharing of the source region of the selection TR Tr4 of the two adjacent TR sets 220 such that no isolation area exists per one shared pixel 210 will be described in more detail with reference to FIG. 9.

In the image sensor 200 according to the present embodiment, the shared pixel 210 and the TR set 220 having the above-described structure can increase the area of a photodiode per unit shared pixel and reduce noise.

Figure 8B:
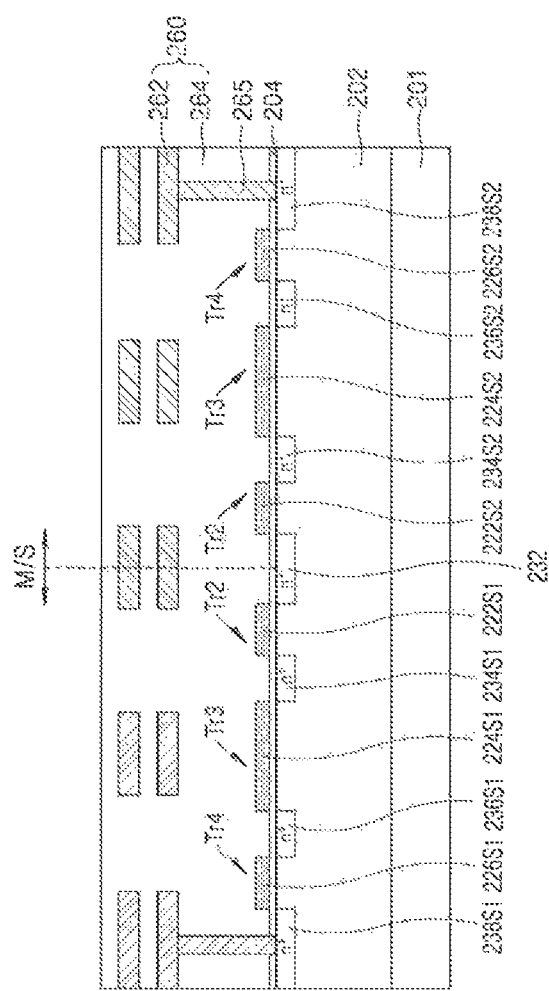
FIG. 8B is a cross-sectional view of the image sensor taken along line III-III' of FIG. 8A according to an exemplary embodiment of the inventive concept.

FIG. 8A is a schematic plan view of the main part of the pixel unit of the image sensor of FIG. 7A, according to an exemplary embodiment of the inventive concept, and FIG. 8B is a cross-sectional view of the image sensor taken along line III-III' of FIG. 8A, according to an exemplary embodiment of the inventive concept.

Referring to FIG. 8A, the image sensor 200 according to the present embodiment may have a structure including the shared pixel 210 in which eight photodiodes PD1 to PD8 of eight pixels share one FD area 230. In the eight photodiodes PD1 to PD8, four photodiode pairs PD1-PD2, PD3-PD4, PD5-PD6, and PD7-PD8, each of which includes two photodiodes, may be arranged in the second direction (the y-direction). Thus, the shared pixel 210 may have a rectangular shape in the second direction (the y-direction). The shared pixels 210 may be arranged in a two-dimensional array structure in which a plurality of shared pixels 210 are arranged in the first direction (the x-direction) and the second direction (the y-direction), as illustrated in FIG. 12.

The FD area 230 may include a top FD area 230S1 and a bottom FD area 230S2, and the shared pixel 210 may include a top shared pixel 210S1 and a bottom shared pixel 210S2. For example, the top shared pixel 210S1 may include four photodiodes PD1 to PD4 that share the top FD area 230S1, and the bottom shared pixel 210S2 may include four photodiodes PD5 to PD8 that share the bottom FD area 230S2.

The pixel area of the image sensor 200 according to the present embodiment may be substantially the same as the pixel area of the image sensor 100 of FIG. 2 except that the top FD area 230S1 and the bottom FD area 230S2 are electrically connected to each other through the interconnection 280 and the top shared pixel 210S1 and the bottom shared pixel 210S2 constitute one shared pixel 210. For example, the structure of each of the top shared pixel 210S1 and the bottom shared pixel 210S2 may be substantially the same as the structure of the shared pixel 110 of the image sensor 100 of FIG. 2 except for the interconnection 280. In addition, a cross-sectional view of each of the top shared pixel 210S1 and the bottom shared pixel 210S2 may be substantially the same as the cross-sectional view of FIG. 3A. Thus, detailed descriptions of the shared pixel 210, the FD area 230 and the transfer TRs Tr will be omitted.

The corresponding TR set 220 adjacent to the shared pixel 210 may be arranged in the TR area (TA of FIG. 7A). The TR set 220 may be continuously arranged along the second direction (the y-direction) and may be arranged alternately with the shared pixel 210 along the first direction (the x-direction). The TR set 220 may include a top TR set 220S1 disposed at an upper portion of the TR set 220 and a bottom TR set 220S2 disposed at a lower portion of the TR set 220. For example, the top TR set 220S1 may be disposed above the equivalent FD area EFD and the bottom TR set 220S2 may be disposed below the equivalent FD area EFD. Each of the top TR set 220S1 and the bottom TR set 220S2 may include a reset TR Tr2, a source follower TR Tr3, and a selection TR Tr4 and may be in a mirror symmetry (M/S) relationship with respect to the equivalent FD area EFD.

The TR set 220 will be described in more detail with reference to FIG. 8B. Because the top TR set 220S1 and the bottom TR set 220S2 are in a mirror symmetry (M/S) relationship with respect to the equivalent FD area EFD, the top TR set 220S1 will be mainly described. It is to be understood that the equivalent FD area EFD corresponds to the source region 232 of the reset TR Tr2. The TRs Tr2, Tr3, and Tr4 of the TR set 220 may be formed in the semiconductor well area 202 formed on the semiconductor substrate 201. Descriptions of the semiconductor substrate 201 and the semiconductor well area 202 are the same as those of the semiconductor substrate 101 and the semiconductor well area 102 in FIGS. 3A and 3B.

The reset TR Tr2 may include a pair of source/drain regions 232 and 234S1 and a reset gate electrode 222S1. The reset gate electrode 222S1 may be formed on a gate insulating layer 204. The source follower TR Tr3 may include a pair of source/drain regions 234S1 and 236S1, and a source follower gate electrode 224S1 formed on the gate insulating layer 204. The selection TR Tr4 may include a pair of source/drain regions 236S1 and 238S1, and a selection gate electrode 226S1 on the gate insulating layer 204.

A second isolation area 250T for isolating the TRs Tr2, Tr3, and Tr4 may be formed in the TR area TA. The second isolation area 250T may include an insulating layer 251 on the surface of the second isolation area 250T and a semiconductor layer under the insulating layer 251. The insulating layer 251 may be formed as an oxide layer such as a silicon oxide layer, and the semiconductor layer may be formed as a p-type high-concentration impurity layer. The second isolation layer 250T is not limited to the structure of the insulating layer 251 and the semiconductor layer and may be formed in an STI structure. First isolation area 250P may include an insulating layer 252.

As illustrated in FIG. 8B, no isolation area for junction isolation may be formed in the TR area TA. In other words, the second isolation area 250T may be formed only in a structure in which the TRs Tr2, Tr3 and Tr4 are isolated from the photodiodes PD1 to PD8 of the shared pixel 210. Thus, no isolation area for junction isolation between the TRs Tr2, Tr3, and Tr4 may be separately formed.

For example, as described above, because the equivalent FD area EFD is shared by two reset TRs Tr2 as the source region 232, there is no need for forming an isolation area in the TR set 220. In addition, because two adjacent TR sets 220 share the source region 238S1 or 238S2 of the selection TR Tr4 along the second direction (the y-direction), there is no need for forming an isolation area between two adjacent TR sets 220. As a result, in the image sensor 200 according to the present embodiment, no isolation area for junction isolation may be formed in the TR area TA. Thus, the image sensor 200 according to the present invention may reduce noise and increase the area of a photodiode per unit shared pixel.

FIG. 8A further shows transfer gate electrodes 228a to 228d of the top shared pixel 210S1. Similar transfer gate electrodes can be found in the bottom shared pixel 210S2, for example. FIG. 8A further shows an output vertical contact 265.

FIG. 8B further shows a multi-layer interconnection layer 260 that includes a plurality of interconnections 262 and an interlayer insulating layer 264, for example. The output vertical contact 265 may be connected to at least one of the interconnections 262.

Figure 9:
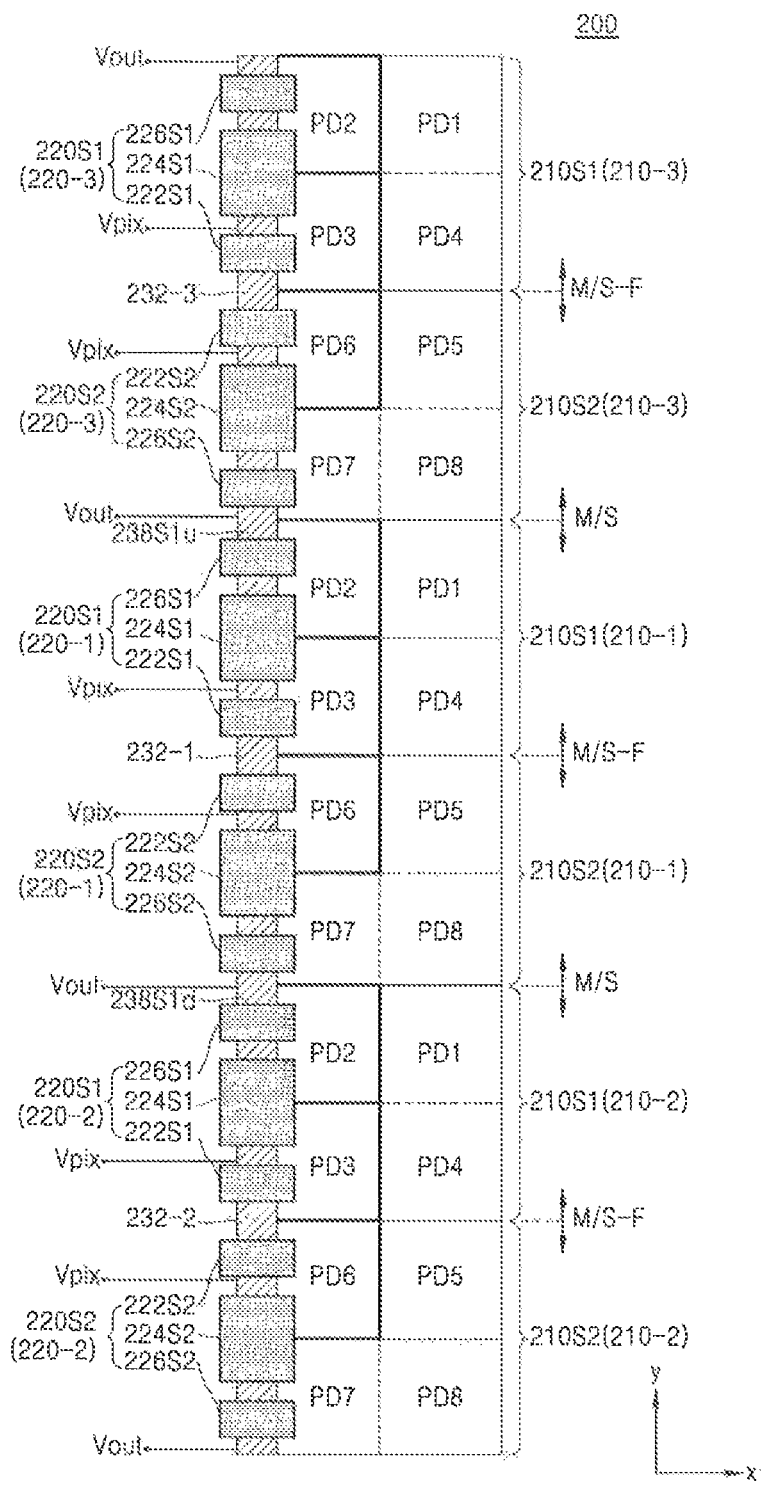
FIG. 9 is an enlarged view of the main part of the pixel unit of the image sensor of FIG. 7A according to an exemplary embodiment of the inventive concept.

FIG. 9 is an enlarged view of the main part of the pixel unit of the image sensor of FIG. 7A, according to an exemplary embodiment of the inventive concept.

Referring to FIG. 9, along the second direction (the y-direction), the second shared pixel 210-2 may be disposed adjacent to the first shared pixel 210-1 and below the first shared pixel 210-1, and the third shared pixel 210-3 may be disposed adjacent to the first shared pixel 210-1 and above the first shared pixel 210-1. Each of the second shared pixel 210-2 and the third shared pixel 210-3 may include a top shared pixel 210S1 and a bottom shared pixel 210S2.

Along the second direction (the y-direction), the second TR set 220-2 corresponding to the second shared pixel 210-2 may be disposed adjacent to the first TR set 220-1, and third TR set 220-3 corresponding to the third shared pixel 210-3 may be disposed adjacent to the first TR set 220-1. Each of the second TR set 220-2 and the third TR set 220-3 may include a top TR set 220S1 and a bottom TR set 220S2. In addition, each of the first TR set 220-1, the second TR set 220-2, and the third TR set 220-3 may have a mirror symmetry (M/S-F) structure with respect to the equivalent FD area EFD, e.g., the source regions 232-1, 232-2, and 232-3 of the reset TR Tr2. In other words, in each of the first TR set 220-1, the second TR set 220-2 and the third TR set 220-3, the top TR set 220S1 and the bottom TR set 220S2 may be in mirror symmetry (M/S-F) relationship with respect to the equivalent FD area EFD.

The selection TR Tr4 of the first TR set 220-1 and the selection TR Tr4 of the second TR set 220-2 may share a source region 238S1d. In addition, the selection TR Tr4 of the first TR set 220-1 and the selection TR Tr4 of the third TR set 220-3 may share a source region 238S1u. Thus, the first TR set 220-1 and the second TR set 220-2 may be in a mirror symmetry (M/S) relationship with respect to the source region 238S1d, and the first TR set 220-1 and the third TR set 220-3 may be in a mirror symmetry (M/S) relationship with respect to the source region 238S1u. In addition, as illustrated in FIG. 9, the output voltage Vout may be output through the source regions 238S1u and 238S1d.

Because the first TR set 220-1 and the second TR set 220-2 share the source region 238S1d, no isolation area may be formed between the first TR set 220-1 and the second TR set 220-2. In addition, because the first TR set 220-1 and the third TR set 220-3 share the source region 238S1u, no isolation area may be formed between the first TR set 220-1 and the third TR set 220-3. As a result, along the second direction (the y-direction), no isolation area may be formed between the TR sets 220. Thus, in the image sensor 200 according to the present embodiment, no isolation area may be formed per one shared pixel.

Figure 10:
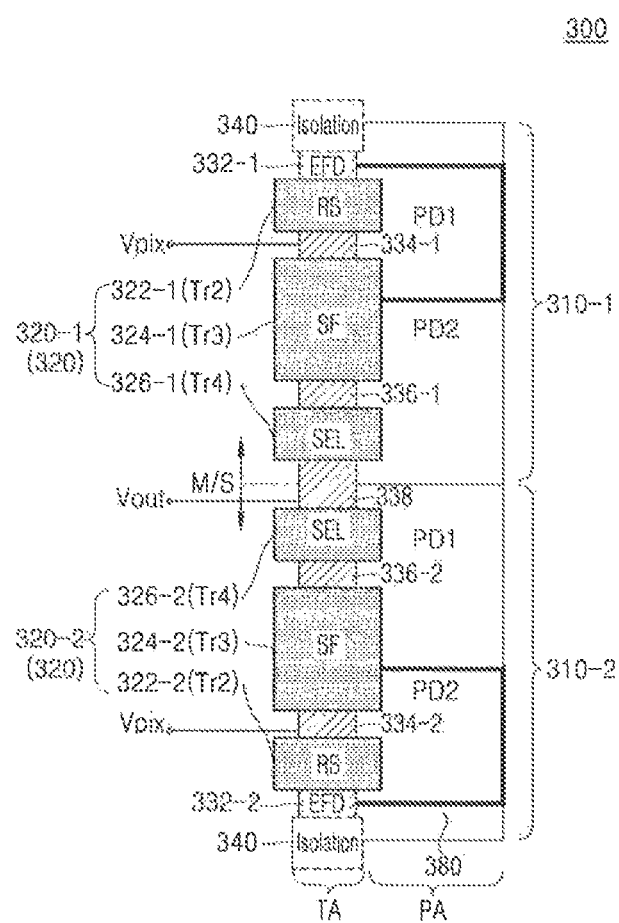
FIG. 10 is a view of a main part of a pixel unit of an image sensor according to an exemplary embodiment of the inventive concept.
Figure 11:
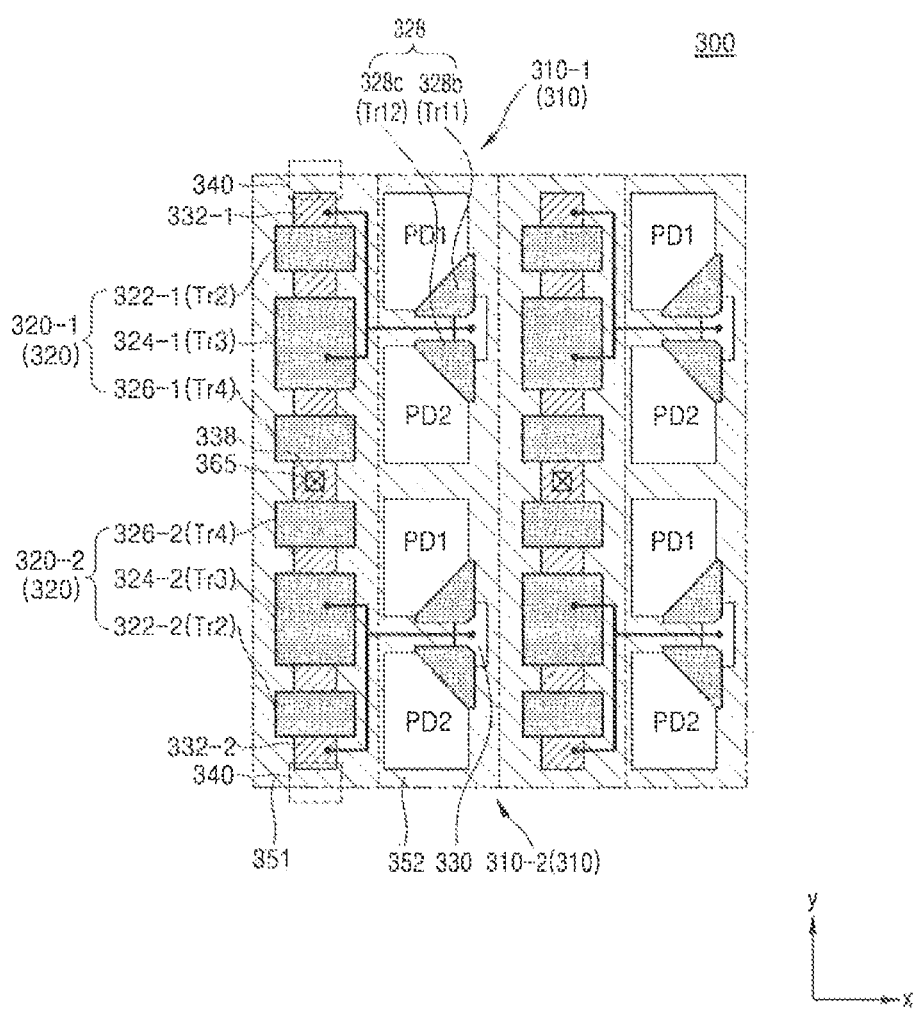
FIG. 11 is a schematic plan view of the main part of the pixel unit of the image sensor of FIG. 10 according to an exemplary embodiment of the inventive concept.

FIG. 10 is a view of a main part of a pixel unit of an image sensor according to an exemplary embodiment of the inventive concept, and FIG. 11 is a schematic plan view of the main part of the pixel unit of the image sensor illustrated in FIG. 10 according to an exemplary embodiment of the inventive concept.

Referring to FIGS. 10 and 11, in an image sensor 300 according to the present embodiment, two pixels may constitute one shared pixel 310. For example, the shared pixel 310 may include two photodiodes PD1 and PD2 adjacent to each other in the second direction (the y-direction). In addition, the shared pixel 310 may have a structure in which two photodiodes PD1 and PD2 share one FD area 330 at upper and lower portions thereof.

In the shared pixel 310, the sharing of one FD area 330 by the two photodiodes PD1 and PD2 may be done by using transfer TRs Tr1 corresponding to the photodiodes PD1 and PD2. For example, two transfer TRs Tr11 and Tr12 corresponding to the two photodiodes PD1 and PD2 may share the FD area 330 as a common drain region.

Sharing in the shared pixel 310 may mean that the two photodiodes PD1 and PD2 share the FD area 330 and the two photodiodes PD1 and PD2 share one TR set 320. The TR set 320 may be disposed adjacent to the pixel area PA in the TR area TA, and one TR set 320 may be disposed per one shared pixel 310. As a result, the two photodiodes PD1 and PD2 that constitute the shared pixel 310 may share one TR set 320.

As can be seen in FIG. 11, the structure of the shared pixel 310 of the image sensor 300 according to the present embodiment may be a half of the structure of the shared pixel 110 of the image sensor 100 of FIG. 2. For example, the left half of the structure shown in FIG. 2 is shown in FIG. 11. The structure of the shared pixel 310 of the image sensor 300 according to the present embodiment may be sufficiently understood based on the structure of the shared pixel 110 of the image sensor 100 of FIG. 2, and thus, detailed descriptions thereof may be omitted.

The structure of the TR set 320 of the image sensor 300 according to the present embodiment may be substantially the same as the structure of the TR set 120 of the image sensor 100 of FIG. 2. For example, the FD area 330 may be electrically connected to source regions 332-1 and 332-2 of the reset TRs Tr2, e.g., an equivalent FD area EFD and source follower gate electrodes 324-1 and 324-2 through interconnection 380. Thus, the source regions 332-1 and 332-2 of the reset TRs Tr2, and the source follower gate electrodes 324-1 and 324-2 may form an equipotential area with respect to the FD area 330. In addition, the first TR set 320-1 and the second TR set 320-2 may share a source region 338 of the selection TR Tr4 and may be in a mirror symmetry (M/S) relationship with respect to the source region 338. Thus, no isolation area for junction isolation may be formed between the first TR set 320-1 and the second TR set 320-2. The structure of the TR set 320 of the image sensor 300 according to the present embodiment may be sufficiently understood based on the structure of the TR set 120 of the image sensor 100 of FIG. 2, and thus, detailed descriptions thereof may also be omitted.

For example, in the image sensor 300 according to the present embodiment, a unit shared pixel may include two photodiodes PD1 and PD2, two transfer TRs Tr11 (a transfer gate electrode 328b) and Tr12 (a transfer gate electrode 328c), a reset TR Tr2 (a reset gate electrode 322-1/322-2), a source follower TR Tr3 (a source follower gate electrode 324-1/324-2), and a selection TR Tr4 (a selection gate electrode 326-1/326-2). The image sensor 300 according to the present embodiment may be a CMOS image sensor, for example. The image sensor 300 may also include insulating layers 351 and 352.

In the image sensor 300 according to the present embodiment, the shared pixel 310 may have a structure in which two photodiodes PD1 and PD2 share one FD area 330. In addition, the first TR set 320-1 and the second TR set 320-2 adjacent to the first TR set 320-1 in the second direction (the y-direction) may share a source region 338 of the selection TR Tr4. Thus, an isolation area for junction isolation may be omitted between the first TR set 320-1 and the second TR set 320-2. For reference, in an existing image sensor having a structure in which two photodiodes are shared by a shared pixel, one isolation area may be formed per one shared pixel. In contrast, in the image sensor 300 according to the present embodiment, a half isolation area 340 may be formed per one shared pixel.

In the image sensor 300 according to the present embodiment, the shared pixel 310 and the TR set 320 having the above-described structure increases the area of a photodiode per unit shared pixel and reduces noise in the image sensor 300.

FIG. 12 is a view schematically illustrating a configuration of an image sensor according to an exemplary embodiment of the inventive concept.

Referring to FIG. 12, an image sensor 400 according to the present embodiment may include a pixel unit 420 and a peripheral circuit unit. The pixel unit 420 may include a plurality of pixels 410, each of which includes a photoelectric conversion device, arranged on a semiconductor substrate 401 in a two-dimensional array structure. The photoelectric conversion device may be a photodiode, for example. In addition, each of the plurality of pixels 410 may be a unit shared pixel including shared pixels 110, 110X, 210, and 310 employed in the image sensors 100, 100a, 100b, 200, and 300 and the corresponding TR sets 120, 120X, 220, and 320 illustrated in FIGS. 1A to 11.

The peripheral circuit unit may be disposed around the pixel unit 420 and may include a vertical drive circuit 440, a column signal processor circuit 450, a horizontal drive circuit 460, an output circuit 470, and a control circuit 480.

The control circuit 480 may control the vertical drive circuit 440, the column signal processor circuit 450, and the horizontal drive circuit 460. For example, the control circuit 480 may generate clock signals or control signals that are used for an operation of the vertical drive circuit 440, the column signal processor circuit 450, and the horizontal drive circuit 460 based on a vertical synchronization signal, a horizontal synchronization signal, and a master clock signal. In addition, the control circuit 480 may input the clock signals or control signals to the vertical drive circuit 440, the column signal processor circuit 450, and the horizontal drive circuit 460.

The vertical drive circuit 440 may include a shift register, for example, may select a pixel driving interconnection, and may supply pulse signals for driving pixels to the selected pixel driving interconnection, thereby driving the pixels in units of a row. For example, the vertical drive circuit 440 may selectively scan the pulse signals in units of a row onto each pixel 410 of the pixel unit 420 in a vertical direction. In addition, the vertical drive circuit 440 may supply the pixel signals according to electric charges generated in the photoelectric conversion device of each pixel 410, for example, a photodiode, to the column signal processor circuit 450 through the vertical signal line 432.

The column signal processor circuit 450 may be arranged in each column of the pixels 410 and perform signal processing such as noise removal in each pixel column, on signals output from the pixels 410 in one row. For example, the column signal processor circuit 450 may perform signal processing such as correlated-double sampling (CDS) for removing noise in the pixels 410 or signal amplification, analog-to-digital (AD) conversion, and the like. A horizontal selection switch may be installed at an output terminal of the column signal processor circuit 450.

The horizontal drive circuit 460 includes a shift register, for example, and sequentially outputs horizontal scanning pulse signals, thereby selecting each column signal processor circuit 450 and outputting pixel signals of each column signal processor circuit 450 to a horizontal signal line 434 in order.

The output circuit 470 may perform signal processing on signals sequentially supplied (to the output circuit 470) from each column signal processor circuit 450 through the horizontal signal line 434 and may output the signal-processed signals. For example, the output circuit 470 may perform buffering or black level adjustment, thermal non-uniformity correction, and various types of digital signal processing. An input/output terminal 490 may exchange signals with the outside.

Figure 13:
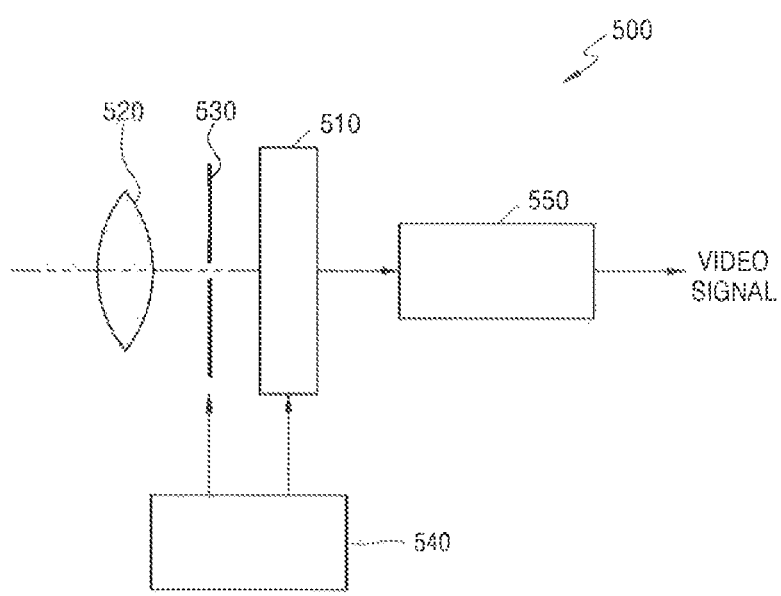
FIG. 13 is a view schematically illustrating an electronic apparatus including an image sensor according to an exemplary embodiment of the inventive concept.

FIG. 13 is a view schematically illustrating an electronic apparatus including an image sensor according to an exemplary embodiment of the inventive concept.

Referring to FIG. 13, an electronic apparatus 500 according to the present embodiment may include an image sensor 510, an optical system 520, a shutter 530, a driving circuit 540, and a signal processor circuit 550.

The image sensor 510 may be one of the image sensors 100, 100a, 100b, 200, and 300 of FIGS. 1A to 11. The image sensor 510 may include the pixel unit 420 and the peripheral circuit unit, as illustrated in FIG. 12.

The optical system 520 is a device for inducing incident light to a light-receiving unit of the image sensor 510 and may include a plurality of optical lenses. For example, the optical system 520 may form an image of incident light from a subject on an image surface of the image sensor 510, and electric charges may be generated and accumulated in the image sensor 510.

The shutter 530 may control an irradiation period of light onto the image sensor 510 and a light-blocking period. The driving circuit 540 may supply driving signals for controlling a transmission operation of the image sensor 510 and an operation of the shutter 530. The image sensor 510 may perform signal transmission by using the driving signals (or timing signals) supplied from the driving circuit 540.

The signal processor circuit 550 may perform various types of signal processing on the signals output from the image sensor 510. Video signals that are signal-processed, may be stored in a storage medium such as memory, or output to a monitor.

The electronic apparatus 500 according to the present embodiment may be a CMOS camera capable of photographing still images or taking videos.

As described above, in an image sensor and an electronic apparatus including the image sensor according to an exemplary embodiment of the inventive concept, two adjacent shared pixels and two adjacent corresponding transistor sets share a source region of a selection transistor, and thus, are arranged in a mirror symmetry structure. Therefore, an isolation area for junction isolation between the two transistor sets is not necessary.

Thus, in the image sensor and the electronic apparatus including the image sensor according to an exemplary embodiment of the inventive concept, the area of a photodiode per shared pixel may be increased and noise may be reduced due to the structure of the above-described shared pixels and TR sets.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. An image sensor, comprising:
   a first shared pixel including eight photodiodes that share a floating diffusion (FD) area, the eight photodiodes forming four photodiode pairs, each of the photodiode pairs including two adjacent photodiodes arranged along a first direction; and
   a first transistor (TR) set disposed adjacent to the first shared pixel and comprising a top selection TR, a top source follower TR, a top reset TR, a bottom reset TR, a bottom source follower TR, and a bottom selection TR, which are arranged along a second direction crossing the first direction in the order of the top selection TR, the top source follower TR, the top reset TR, the bottom reset TR, the bottom source follower TR and the bottom selection TR,
   wherein the first TR set has a mirror symmetry structure with respect to an equivalent FD area shared by the top reset TR and the bottom reset TR.

2. The image sensor of claim 1, wherein a second shared pixel and a third shared pixel are adjacent to the first shared pixel along the second direction on opposite sides of the first shared pixel, the first TR set and a second TR set of the second shared pixel share a source region of the top selection TR, and the first TR set and a third TR set of the third shared pixel share a source region of the bottom selection TR.

3. The image sensor of claim 2, wherein the first TR set and the second TR set are in a mirror symmetry relationship with respect to the source region of the top selection TR, the first TR set and the third TR set are in a mirror symmetry relationship with respect to the source region of the bottom selection TR, and no isolation area is formed between the first TR set and the second TR set and between the first TR set and the third TR set.

4. The image sensor of claim 1, wherein the equivalent FD area is connected to a gate electrode of the top source follower TR and a gate electrode of the bottom source follower TR through an interconnection.

5. An image sensor, comprising:
   a first shared pixel including eight photodiodes that share a floating diffusion (FD) area, the eight photodiodes forming four photodiode pairs, each of the photodiode pairs including two adjacent photodiodes arranged along a first direction; and
   a first transistor (TR) set disposed adjacent to the first shared pixel and comprising a top selection TR, a top source follower TR, a top reset TR, a bottom reset TR, a bottom source follower TR, and a bottom selection TR, which are sequentially arranged along a second direction crossing the first direction,
   wherein the first TR set has a mirror symmetry structure with respect to an equivalent FD area shared by the top reset TR and the bottom reset TR, wherein a second shared pixel and a third shared pixel are adjacent to the first shared pixel along the second direction on opposite sides of the first shared pixel, the first TR set and a second TR set of the second shared pixel share a source region of the top selection TR, and the first TR set and a third TR set of the third shared pixel share a source region of the bottom selection TR.

6. The image sensor of claim 5, wherein the first TR set and the second TR set are in a mirror symmetry relationship with respect to the source region of the top selection TR, the first TR set and the third TR set are in a mirror symmetry relationship with respect to the source region of the bottom selection TR, and no isolation area is formed between the first TR set and the second TR set and between the first TR set and the third TR set.

7. An image sensor, comprising:
- a first shared pixel including eight photodiodes that share a floating diffusion (FD) area, the eight photodiodes forming four photodiode pairs, each of the photodiode pairs including two adjacent photodiodes arranged along a first direction; and
- a first transistor (TR) set disposed adjacent to the first shared pixel and comprising a top selection TR, a top source follower TR, a top reset TR, a bottom reset TR, a bottom source follower TR, and a bottom selection TR, which are sequentially arranged along a second direction crossing the first direction,
- wherein the first TR set has a mirror symmetry structure with respect to an equivalent FD area shared by the top reset TR and the bottom reset TR,
- wherein the equivalent FD area is connected to a gate electrode of the top source follower TR and a gate electrode of the bottom source follower TR through an interconnection.

\* \* \* \* \*